US005361015A

United States Patent [19]

Okunuki et al.

[11] Patent Number: 5,361,015

[45] Date of Patent: Nov. 1, 1994

[54] ELECTRON EMISSION ELEMENT

[75] Inventors: Masahiko Okunuki, Itsukaichi; Akira Suzuki, Yokohama; Isamu Shimoda, Zama; Tetsuya Kaneko, Yokohama; Takeo Tsukamoto, Atsugi; Toshihiko Takeda, Tokyo; Takao Yonehara, Atsugi; Takeshi Ichikawa, Sendai, all of Japan

[73] Assignee: Canon Kabushiki Kaisha, Tokyo, Japan

[21] Appl. No.: 11,006

[22] Filed: Jan. 29, 1993

Related U.S. Application Data

[60] Division of Ser. No. 848,727, Mar. 9, 1992, Pat. No. 5,201,681, which is a division of Ser. No. 746,154, Aug. 14, 1991, Pat. No. 5,176,557, which is a continuation of Ser. No. 463,783, Jan. 8, 1990, abandoned, which is a division of Ser. No. 151,961, Feb. 3, 1988, abandoned.

[30] Foreign Application Priority Data

| | | | |
|---|---|---|---|
| Feb. 6, 1987 | [JP] | Japan | 63-024872 |
| Feb. 6, 1987 | [JP] | Japan | 63-024873 |
| Feb. 23, 1987 | [JP] | Japan | 63-038075 |
| Feb. 23, 1987 | [JP] | Japan | 63-038076 |
| Mar. 4, 1987 | [JP] | Japan | 63-047816 |
| Mar. 6, 1987 | [JP] | Japan | 63-050344 |
| Mar. 9, 1987 | [JP] | Japan | 63-052113 |
| Mar. 24, 1987 | [JP] | Japan | 63-067892 |
| Mar. 26, 1987 | [JP] | Japan | 63-070467 |
| Mar. 27, 1987 | [JP] | Japan | 63-073601 |

[51] Int. Cl.[5] .......... H01J 7/06; H01L 21/02

[52] U.S. Cl. .......... 313/309; 313/336; 437/83

[58] Field of Search .......... 437/83, 84; 313/309, 313/351, 336

[56] References Cited

U.S. PATENT DOCUMENTS

| | | | |
|---|---|---|---|
| 4,513,308 | 4/1985 | Greene et al. | 313/309 X |
| 4,721,885 | 1/1988 | Brodie | 313/576 |
| 4,999,313 | 3/1991 | Arikawa et al. | 437/83 X |

*Primary Examiner*—Sandra L. O'Shea

*Attorney, Agent, or Firm*—Fitzpatrick, Cella, Harper & Scinto

[57] ABSTRACT

A multi type electron emission element comprises a plurality of electrodes formed on a deposition surface of an insulating material and each having a conical portion of a single crystal, an insulating layer formed on the deposition surface and having openings respectively centered on the conical portions, and a deriving electrodes, part of which is formed near at least the conical portions, the deriving electrode being formed on the insulating layer.

26 Claims, 27 Drawing Sheets

ELECTRON EMISSION ELEMENT

This application is a division of application Ser. No. 07,848,727 filed on Mar. 9, 1992, now U.S. Pat. No. 5,201,681 which is a divisional of application Ser. No. 07/746,154 filed on Aug. 14, 1991, now U.S. Pat. No. 5,176,557 which is a continuation of application Ser. No. 07,463,783 filed on Jan. 8, 1990 now abandoned which is a divisional application Ser. No. 07/151,961 filed on Feb. 3, 1988 now abandoned.

BACKGROUND OF THE INVENTION

1. Field of the Invention

The present invention relates to an electron emission element and a method of manufacturing the same, and more particularly, to an electron emission element having a plurality of electrodes each having a conical portion, an insulating layer having openings centered on conical portions, and a deriving electrode, at least part of which is formed near conical portions, and a method of manufacturing the electron emission element.

2. Related Background Art

Hot cathode electron emission elements have been frequently utilized as conventional electron emission source. Electron emission utilizing hot electrodes has large energy loss by heating and preheating is undesirably required.

In order to solve these problems, several cold cathode electron emission elements have been proposed. Of these elements, a field effect electron emission element for emitting electrons by electric field A typical example of the field effect electron emission element is shown in a partial sectional view of FIG. 1, and steps in manufacturing this electron emission element are shown in FIGS. 2A to 2D.

As shown in FIG. 1, each conical electrode 19 made of Mo (molybdenum) or the like is formed on a substrate 21 of, e.g., silicon. An insulating layer 20 such as an $SiO_2$ layer has an opening. This opening is centered on the electrode 19. A deriving electrode 18, part of which is formed near the conical portion is formed on the insulating layer 20.

In the electron emission element having the above structure, a voltage is applied between the substrate 21 and the electrode 18, electrons are emitted from the conical portion having a high field intensity.

The above electron emission element is manufactured by the following steps.

As shown in FIG. 2A, the insulating layer 20 as an oxide film (e.g., an $SiO_2$ film) is formed on the substrate 21 of, e.g., Si. The Mo layer 18 is formed by electron beam epitaxy, and an electron beam resist such as PMMA (polymethyl methacrylate) is spin-coated on the Mo layer 18. The resist film is irradiated with an electron beam and is patterned. The resist is partially removed with isopropyl alcohol or the like, thereby selectively etching the Mo layer 18 and hence forming a first opening 22. After the electron beam resist is completely removed, hydrofluoric acid is used to etch the insulating layer 20, thereby forming a second opening 23.

As shown in FIG. 2B, the substrate 21 is slightly inclined by an angle $\theta$ while being rotated about an axis X, and an Al layer 24 is formed on the upper surface of the Mo layer 18. In this case, aluminum is also deposited on the side surface of the Mo layer 18. By controlling the deposition rate of aluminum, the diameter of the first opening 22 can be arbitrarily reduced.

As shown in FIG. 2C, Mo is vertically deposited by electron beam epitaxy on the substrate 21. In this case, molybdenum is deposited on the Al layer 24 and the substrate 21 as well as the side surface of the Al layer 24. The diameter of the first opening 22 can be gradually reduced when deposition of the Mo layer progresses. When the diameter of the first opening 22 is reduced, the deposition area of the metal (Mo) deposited on the substrate 21 is reduced. Therefore, a substantially conical electrode 19 is formed on the substrate 21.

Finally, as shown in FIG. 2D, by removing the deposited Mo layer 25 and the deposited Al layer 24, an electron emission element having the substantially conical electrode 19 is prepared.

In the conventional electron emission element described above, the height, the angle, and the diameter of the bottom surface of the electrode are determined by various manufacturing conditions such as the size of the first opening, the thickness of the oxide film, and the distance between the substrate and the deposition source. Therefore, reproducibility of the electrode is degraded. When a plurality of electron emission elements are simultaneously formed, variations in conical shape typically occur.

SUMMARY OF THE INVENTION

It is a first object of the present invention to provide a multi-type electron emission element and a method of manufacturing the same, wherein variations in shape of an electrode having a conical portion serving as an electron emission portion can be prevented and performance of the element can be improved.

In order to achieve the above object of the present invention, there is provided a multi-type electron emission element comprising a plurality of electrodes each having a conical portion of a single crystal and formed on a deposition surface of an insulating material, an insulating layer formed on the deposition surface and having openings respectively centered on the conical portions, and a deriving electrode, part of which is formed near each conical portion.

A method of manufacturing the above multi-type electron emission element comprises the steps of:

forming a plurality of recesses in an insulating substrate;

forming a plurality of electrodes each having a conical portion of a single crystal grown by a single nucleus grown in a heterogeneous material having a sufficiently higher nucleation density than the insulation material at the bottom of each of the plurality of recesses and having a micropattern enough to allow the growth of the single nucleus;

forming a deriving electrode, part of which is formed at least near the conical portions.

The single crystals include crystals having substantially single crystal structures (this is applied to the following description).

In the above multi-type electron emission element, the plurality of electrodes each having a conical portion are made of a single crystal, and conductivity of the electrode with a conical portion can be improved. The electron emission portion of the conical portion can be matched with a crystal surface having a predetermined structure, thereby improving the Schottky effect and hence electron emission efficiency. Furthermore, the plurality of electrodes each having the conical portion are formed on the deposition surface of the insulating material, and electrical insulation of the electrode can be improved, thereby preventing crosstalk between the adjacent electrodes.

In the method of manufacturing the above multi-type electron emission element, the material which cannot produce a single crystal on the bottom surface (deposition surface) of the recess by crystallinity or the like is deposited using the micropatterned heterogeneous material as its center, thereby allowing deposition of the single crystal. The selection range of the materials on the bottom of the recess and the single crystal can be increased. The electrode having a conical portion at the desired position can be formed. The shapes of the electron emission portions as the conical portions can be made uniform and sharp, thereby increasing and uniforming the intensity of the electric field. Variations in initial operating voltage can be minimized, and electron emission efficiency can be further improved.

It is a second object of the present invention to provide an electron emission element and a method of manufacturing the same, wherein variations in shape of electrodes having conical portions serving as electron emission portions can be prevented, and performance of the element can be improved.

In order to achieve the above object of the present invention, there is provided an electron emission element comprising an electrode formed on a deposition surface and having a conical portion, an insulating layer formed on the deposition surface and having an opening centered on the conical portion, and a deriving electrode formed on the insulating layer near the conical portion, wherein the electrode with the conical portion is made of a single crystal.

A method of manufacturing an electron emission element comprising an electrode formed on a deposition surface and having a conical portion, an insulating layer formed on the deposition surface and having an opening centered on the conical portion, and a deriving electrode formed on the insulating layer near the conical portion, wherein the electrode with the conical portion is made of a single crystal, wherein a heterogeneous material having a sufficiently higher nucleation density than that of a material on the deposition surface and having a micropattern enough to allow growth of only a single nucleus is formed on the deposition surface, and the electrode having the conical portion is formed by the single crystal grown in the heterogeneous material.

The single crystals include crystals having substantially single crystal structures (this is applied to the following description).

In the above electron emission element, the electrode having a conical portion is made of a single crystal, and conductivity of the electrode with a conical portion can be improved. The electron emission portion of the conical portion can be matched with a crystal surface having a predetermined structure, thereby improving Schottky effect and hence electron emission efficiency.

In the method of manufacturing the above electron emission element, the material which cannot produce a single crystal on the bottom surface (deposition surface) of the recess by crystallinity or the like is deposited using the micropatterned heterogeneous material as its center, thereby allowing deposition of the single crystal. The selection range of the materials on the bottom of the recess and the single crystal can be increased. The electrode having a conical portion at the desired position can be formed. The shapes of the electron emission portions as the conical portions can be made uniform and sharp, thereby increasing and uniforming the intensity of the electric field. Variations in initial operating voltage can be minimized, and electron emission efficiency can be further improved.

In order to achieve the second object of the present invention, there is provided an electron emission element comprising a substrate having a conductive material surface, an insulating layer formed on the substrate and having an opening, an electrode having a conical portion of a crystal grown with a single nucleus as its center in a heterogeneous material formed on the insulating layer, the heterogeneous material having a sufficiently higher nucleation density than that of a material of the insulating layer and a micropattern enough to allow the growth of the single nucleus, and a deriving electrode formed on the insulating layer near the conical portion, wherein the conductive material surface is connected to the electrode with the conical portion through the opening.

A method of manufacturing the above electron emission element comprises the steps of:

forming an insulating layer on a substrate having a conductive material surface;

forming a heterogeneous material having a sufficiently higher nucleation density than that of a material of the insulating layer and a micropattern enough to allow the growth of the single nucleus;

forming an opening in the insulating layer to partially expose the conductive material surface; and forming an electrode having a conical portion by growing a crystal having a single nucleus as its center in the heterogeneous material and causing a crystal to grow on an exposed portion of the conductive material surface through the opening, thereby connecting the conductive material surface to the electrode with the conical portion.

Since the electrode with the conical portion is electrically connected to the conductive material surface through the opening formed in the insulating layer in the above electron emission element, the electrode with the conical portion is electrically insulated from the substrate, the packing density can be increased, and connection reliability can be improved.

According to the method of manufacturing the above electron emission element, the electrode with the crystalline conical portion is connected to the conductive material surface through the opening formed in the insulating layer in such a manner that a crystal is deposited on the exposed portion of the conductive material surface through the opening formed in the insulating layer and is connected to the electrode with the crystalline conical portion grown having a single nucleus as its center in the micropatterned heterogeneous material. Therefore, an electrical connection can be performed by a simple process.

Of the conventional cold cathode electron emission elements, a surface conduction type electron emission element is available wherein a large current is supplied to a high-resistance film and electrons are emitted from the high-resistance film.

FIG. 3 is a schematic view of the surface conduction type electron emission element.

As shown in FIG. 3, opposite electrodes 118 and 119 are formed on an insulating substrate 117 made of glass or the like and are spaced part from each other by a predetermined distance. A metal such as Mo (molybdenum) is deposited in the space between the opposite electrodes 118 and 119. The deposition film is energized at a high temperature to cause partial breakdown of the deposition film, thereby forming a high-resistance film 120.

In the electron emission element having the above structure, when a voltage is applied between the electrodes 118 and 119 to supply a current through the high-resistance film 120 and a high voltage is applied to an electrode (not shown) formed on the high-resistance film 120, electrons are emitted from the high-resistance film 120.

In the electron emission element described above, the surface shape of the high-resistance film is the major factor for determining the electron emission characteristics. In order to increase electron emission efficiency, it is preferable that the high-resistance film should be disconnected or island-like, or defected (this surface state is referred to as a contaminated surface state hereinafter). The contaminated surface state occurs due to local emission of high-field electrons, hot electrons, and the like. The contaminated surface state is conventionally obtained by energizing the deposition film at a high temperature and causing local breakdown of the deposition film.

However, in the electron emission electrode using the high-resistance film prepared as described above, the high-resistance film is unstable, and variations in operating voltage and electron emission efficiency are larged. In addition, the electrons are locally emitted to increase a current density, resulting in local breakdown of the high-resistance film.

It is still another object of the present invention to provide an electron emission element wherein the surface shape of a high-resistance film serving as an electron emission portion can be stabilized and electron emission efficiency can be improved.

In order to achieve the above object, there is provided an electron emission element comprising a high-resistance film formed on a deposition film of an insulating material and electrodes formed at both end portions of the high-resistance film, wherein the high-resistance film is made of a crystal having a plurality of conical portions grown by single nuclei in a plurality of heterogeneous material regions each having a sufficiently higher nucleation density than that of a material of the deposition surface and a micropattern enough to allow growth of the single nuclei.

The crystal is defined as an aggregate of single crystal grains (including substantially a single crystal) grown with a single nucleus as its center in each heterogeneous material.

When a single crystal is grown with each single nucleus as its center in each of the plurality of heterogeneous material regions, a plurality of single crystal portions having conical portions unique to the single crystal at desired portions. By controlling the deposition surface materials, heterogeneous material, and types of deposition materials, and the deposition conditions, a plurality of single crystal portions having a desired size can be formed to constitute the high-resistance film in the electron emission element.

In the above electron emission element, a plurality of single crystal portions are uniformly formed with single nuclei as their centers in the plurality of heterogeneous material regions, thereby easily controlling projections on the surface of the high-resistance film.

If fine pitches of conical portions are required to improve the dielectric withstand voltage in the cold cathode electron emission element shown in FIG. 1 or to prepare a multi type electron emission element, an electrode is preferably formed on the insulating material surface.

However, when an electrode is formed on the insulating material surface, a wiring layer may be formed on the insulating material surface or a through hole must be formed in an insulating layer formed on a conductive substrate so as to achieve wiring. This technique poses problems from the viewpoint of mounting densities and connection reliability.

It is still another object of the present invention to provide an electron emission device and a method of manufacturing the same, wherein wiring need not be considered and electron emission at a high packing density can be achieved.

A first electron emission device of this method comprises:

an electron emission electrode with a conical portion;

a voltage application electrode formed to sandwich an insulating film with the electron emission electrode;

a target to be irradiated with electrons emitted from the electron emission electrode;

charge supply means for supplying charge to the electron emission electrode; and means for applying a voltage between the voltage application electrode and the target.

A second electron emission device used for the above method comprises:

a plurality of electron emission electrodes each having a conical portion;

a plurality of voltage application electrodes sandwiching an insulating film with the electron emission electrodes;

a target to be irradiated with electrons emitted from the plurality of electron emission electrodes;

charge supply means for supplying charge to the plurality of electron emission electrodes; and means for applying a voltage to the plurality of voltage application electrodes and the target.

A third electron emission device used for the above method comprises:

an electron emission electrode with a conical portion;

a voltage application electrode sandwiching an insulating film with the electron emission electrode;

a target to be irradiated with electrons emitted from the electron emission electrode; and means for applying a voltage between the voltage application electrode and the target, wherein the insulating film consists of a semiconductive material.

A fourth electron emission device used for the above method comprises:

a plurality of electron emission electrodes each having a conical portion;

a plurality of voltage application electrodes sandwiching an insulating film with the electron emission electrodes;

a target to be irradiated with electrons emitted from the plurality of electron emission electrodes; and means for applying a voltage to the plurality of voltage application electrodes and the target, wherein the insulating film consists of a semiconductive material.

In the above electron emission method, the charge of the electron emission electrode which is lost by electron emission during the electron emission operation is supplied after the electron emission operation, and the electron emission electrode can be formed on the insulating film.

In the first electron emission device, the electron emission electrode with a conical portion and the voltage application electrode are formed to sandwich the insulating film and are capacitively coupled. A voltage is applied to the voltage application electrode and the irradiated target to allow electron emission from the electron emission electrode. The charge lost from the electron emission electrode can be supplied by the charge supply means.

In the first electron emission device, the electrons are supplied from the charge supply means to allow electron emission from the electron emission electrode isolated on the insulating film.

In the second electron emission device, the plurality of electron emission electrodes each with a conical portion and a plurality of voltage application electrodes are formed to sandwich the insulating film and are capacitively coupled. A voltage is applied to the electron application electrodes and the irradiated target to allow electron emission. The charge lost by this electron emission from the electron emission electrodes is supplied from the charge supply means.

That is, in the second electron emission device, the electrons are supplied from the charge supply means to allow electron emission from the plurality of electron emission electrodes isolated on the surface of the insulating film.

If the voltage is time-divisionally applied to the plurality of voltage application electrodes to sequentially apply voltage pulses between the voltage application electrodes and the irradiated target, the circuit load in electron emission control can be reduced.

In the first and second electron emission devices, if a deriving electrode is arranged to increase a field intensity of the electron emission electrode, this electrode can serve as the charge supply means.

In the third electron emission device, the electron emission electrode is formed on the semiconductive material. The charge lost by discharge operation from the electron emission electrode can be supplied through the semiconductive material.

In the fourth electron emission device, the plurality of electron emission electrodes are formed on the semiconductive material, and the charge lost by discharge operation from the plurality of electron emission electrodes can be supplied through the semiconductive material.

The cold cathode electron emission element shown in FIG. 1 has the dimensional and electrical problems due to the following reasons. Since a conical electrode is formed after the insulating layer is etched, it is difficult to keep the deposition surface of the substrate clean, and variations in deposition conditions or the like of the electrode materials occur.

It is still another object of the present invention to provide a method of manufacturing an electron emission element, wherein variations in shape and electrical characteristics of an electrode with a conical portion serving as an electron emission section can be minimized, and performance of the element can be greatly improved.

In order to achieve the above object, there is provided a method of manufacturing an electron emission element, comprising the steps of:

forming an electrode with a conical portion by a crystal grown with a single nucleus in a heterogeneous material formed on a deposition surface, the heterogeneous material having a sufficiently higher nucleation density than that of a material of the deposition surface and a micropattern enough to allow the growth of the single nucleus;

depositing an insulating layer on the electrode with the conical portion and the deposition surface, and forming an electrode layer on the insulating layer;

forming an opening in the electrode layer such that an electrode layer portion corresponds to the conical portion of the electrode with the conical portion; and selectively etching the insulating layer to expose at least the conical portion through the opening.

According to the above method, the electrode with the conical portion serving as an electron emission portion is formed on a clean surface by using as the center the single nucleus formed in the micropatterned heterogeneous material. Thereafter, the insulating layer and then the electrode formed thereon are formed, so that an electrode consisting of a crystal having a small number of defects and an electron emission portion of which has a uniform shape, thereby uniforming and increasing the field intensity and hence preventing variations in initial operating voltage.

In the electron emission element shown in FIG. 1, the operating voltage and the electron emission efficiency undesirably vary due to changes in characteristics because a high-intensity field is applied to the conical portion of the electrode, the current density is increased, and the conical portion is heated and melted.

It is still another object of the present invention to provide an electron emission element wherein heat resistance of an electrode with a conical portion serving as an electron emission portion is high.

In order to achieve the above object, there is provided an electron emission element comprising:

an electrode formed on a deposition surface and having a conical portion; and a deriving electrode formed on the deposition surface through an insulating layer near the conical portion, wherein the electrode with the conical portion comprises a conductive member with the conical portion and a heat-resistive conductive film formed on the conductive member.

In the above electron emission element, the electrode with the conical portion comprises the conductive member with the conical portion and the heat-resistive conductive film formed on the conductive member. The electron emission portion can be made of a heat-resistive conductive film to prevent deformation of the conical portion due to melting by heat. The major portion of the electrode with the conical portion is made of the conductive member having a high conductivity, thereby preventing unnecessary heat radiation.

In the electron emission element shown in FIG. 1, the dielectric breakdown voltage must be increased. In the multi type electron emission element, in order to prevent the influence of the electrodes with adjacent conical portions so as to obtain fine pitches, the electrode with the conical portion is preferably formed on the surface of the insulating layer.

In the multi type electron emission element, in order to emit electrons from a desired position, electron emission of the respective electron emission sources must be controlled.

It is still another object of the present invention to provide an electron emission element wherein the electron emission amount of an electrode with a conical portion can be controlled and the electrode with the conical portion can be formed on the insulating material layer.

In order to achieve the above object, there is provided an electron emission element comprising an electrode with a conical portion on a conductive material through an insulating layer, a deriving electrode formed on the insulating layer through an insulating member near the conical portion, and means for applying a voltage between the conductive material and the electrode.

In the above electron emission element, the electrode with the conical portion is formed on the conductive material through the insulating layer (this structure is referred to as an MIM structure hereinafter). A voltage (v) is applied between the conductive material and the electrode formed on the insulating material surface and having the conical portion, and the electrons can be tunneled through the insulating layer. Therefore, the electrons can be supplied from the conductive material to the electrode with the conical portion. The amount of electrons supplied to the electrode with the conical portion can be controlled by the voltage Z, thereby controlling the amount of electron emission.

CRTs (Cathode-Ray Tubes) have been mainly used as conventional display devices in OA systems such as a wordprocessor and a personal computer in favor of a clear image and high brightness.

In the CRT, electrons emitted from an electron source are deflected and scanned by a magnetic field generated by a deflection coil and the deflected electrons are bombarded on a phosphor screen of R, G, and B (in the case of color CRT), thereby performing a display. Since the deflection distance corresponds to the size of the display screen, the distance for shifting the electrons is increased. For this reason, the distance between the electron source and the phosphor screen is undesirably increased and a flat CRT cannot be provided.

Liquid crystal display units, plasma display units, EL (Electroluminescence) unit, and the like have received a great deal of attention as flat display devices. The liquid crystal element requires a light source (natural light) since it is a light-receiving element and tends to be adversely affected by brightness variations in light source. In addition, it is difficult for the liquid crystal itself to perform a color display of three or more colors. The plasma display and EL units are light-emitting elements and do not have the problems posed by the light-receiving element. These units as monochromatic products can be commercially available. However, multi-color display cannot be satisfactorily performed due to a difference of luminous efficacy values at different wavelengths of the light sources, and these units are still expensive.

It is still another object of the present invention to provide a flat display device using a field effect electron emission element.

In order to achieve the above object, there is provided a display device comprising an electrode formed on a deposition surface and having a conical portion, a deriving electrode formed on the deposition surface near the conical portion, and a phosphor unit opposite to the electrode with the conical portion, wherein the phosphor unit is energized by electrons emitted from the electrode with the conical portion.

In the above display device, the amount of electron emission is controlled by a voltage applied between the deriving electrode and the electrode with the conical portion. The potential of the phosphor unit is set to be higher than that of the electrode with the conical portion. The electrons are emitted onto the phosphor unit and energize it.

An application voltage in the field effect electron emission element shown in FIG. 1 generally requires 100 V or higher. It is difficult to form this element in an IC circuit. Demand has arisen for decreasing the voltage applied to this element.

It is still another object of the present invention to provide an electron emission element wherein the element can be operated at a low voltage, and electron emission efficiency can be improved.

In order to achieve the above object, there is provided an electron emission element comprising an electrode formed on a deposition surface and having a conical portion, and a deriving electrode formed on the deposition surface near the conical portion, wherein the conical portion of the electrode comprises at least a semiconductor crystal obtained by nucleus growth and a material of a low work function.

DETAILED DESCRIPTION OF THE PREFERRED EMBODIMENTS

Preferred embodiments of the present invention will be described with reference to the accompanying drawings.

Figure 4A:
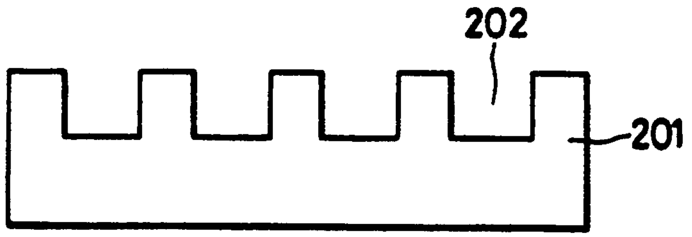
FIGS. 4A to 4D are schematic partial sectional views for explaining the steps in manufacturing a multi type electron emission element according to an embodiment of a method of the present invention.
Figure 4B:
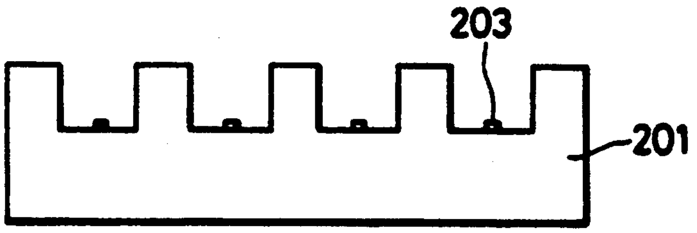
Figure 4C:
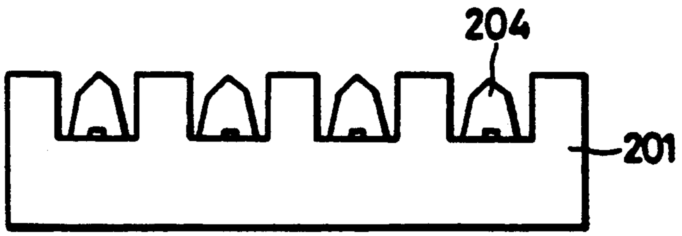
Figure 4D:
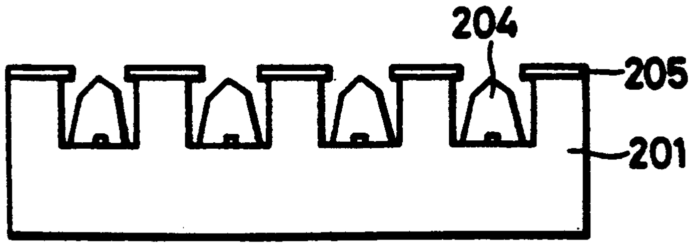
Figure 5A:
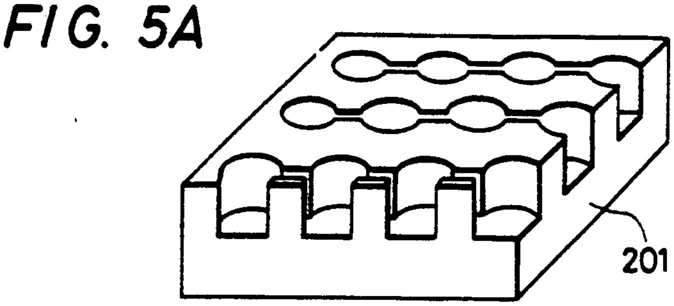
FIGS. 5A to 5C are partial perspective views of FIGS. 4A, 4C, 4D, respectively.
Figure 5B:
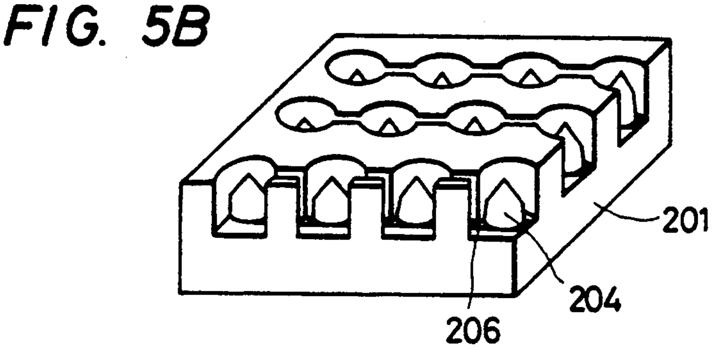
Figure 5C:
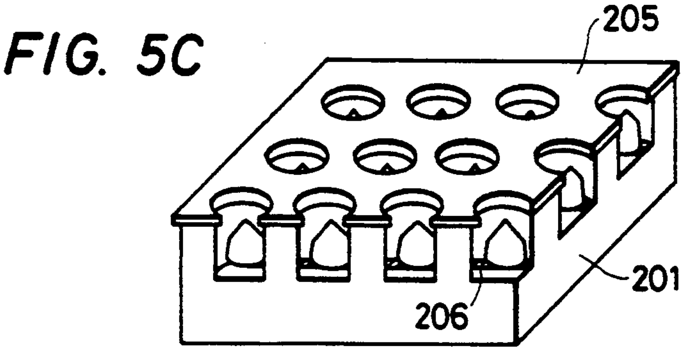

FIGS. 4A to 4D are schematic partial sectional views for explaining the steps in manufacturing a multi type electron emission element according to a method of the present invention, and FIGS. 5A to 5C are partial perspective views of FIGS. 4A, 4C, 4D, respectively.

As shown in FIG. 4A, an oxide substrate 201 made of an insulating material such as $SiO_2$ is patterned by photoetching or the like to form a plurality of cylindrical recesses 202 each having a diameter of about 0.5 to 100μ. As shown in FIG. 4A, grooves are formed between the recesses 202 of the respective arrays.

As shown in FIG. 4B, nucleus formation bases 203 such as Si or $Si_3N_4$ are respectively formed on bottom surfaces (deposition surfaces) of the recesses 202.

As shown in FIG. 4C, single nuclei formed in the nucleus formation bases 203 are used as centers to grow a single crystal such as Mo, W, or Si, thereby forming conical electrodes 204 each having a desired size and a conical portion. As shown in FIG. 5B, the electrodes 204 aligned in each array are commonly connected by a wiring layer 206 formed throughout the corresponding groove formed in the oxide substrate 201. A method of forming the single crystal will be described in detail later. In this embodiment, the bottom surfaces of the recesses 202 of the oxide substrate 201 serve as deposition surfaces, and the side wall portions of the recesses 202 are made of an insulating member. The insulating member may be formed on the deposition surface in another process by using the same material as that of the deposition surface or a material different therefrom.

Finally, as shown in FIGS. 4D and 5C, a metal plate 205 serving as a deriving electrode having a plurality of openings formed by etching is adhered to the oxide substrate 201 such that the centers of the openings are respectively aligned with the centers of the recesses 202, thereby preparing a multi type electron emission element.

In the multi type electron emission element described above shown in FIG. 5C, a voltage is applied between the metal plate 205 and the desired wiring layer 206 such that the potential of the metal plate 205 is higher than that of the desired wiring layer 206, a strong electric field is generated by the conical portions of the corresponding electrodes 204, and electrons are emitted therefrom.

In the multi type electron emission element described above, if the metal plate 205 is divided into strips to constitute a matrix with the electrode wiring layers 206, a matrix type multi electron emission element can be prepared.

Figure 7:
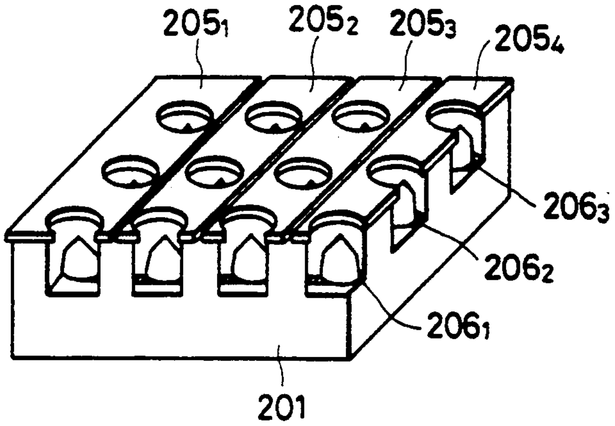
FIG. 7 is a schematic perspective view of a matrix type multi electron emission element.

FIG. 7 is a schematic perspective view of a matrix type multi electron emission element.

Referring to FIG. 7, metal plates $205_1$ to $205_4$ and electrode wiring layers $206_1$ to $206_4$ are arranged in a matrix form. If a voltage is applied between desired ones of the metal plates $205_1$ to $205_4$ and desired ones of electrode wiring layers $206_1$ to $206_4$, a point, line, or surface electron emission source can be obtained.

In the method of manufacturing the above element, the electrode 204 with a conical portion is formed on the oxide substrate 201. However, an oxide film 201*a* may be formed on an underlying substrate to prepare the same electron emission element as described above. In the above embodiment, the metal plate 205 as the deriving electrode is adhered to the substrate. However, the deriving electrode may be formed by depositing a metal layer such as an Mo layer.

FIGS. 6A to 6E are schematic partial sectional views for explaining the steps in manufacturing a multi electron emission element according to another method of the present invention.

Figure 6A:
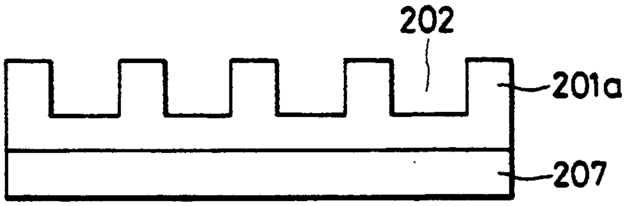
FIGS. 6A to 6E are schematic partial sectional views for explaining the steps in manufacturing a multi-type electron emission element according to the present invention.

As shown in FIG. 6A, an oxide film 201*a* such as an $SiO_2$ film is formed on an underlying substrate 207 such as an Si substrate, and recesses 202 are formed in the oxide film 201*a* in the same manner as in FIG. 4A.

Figure 6B:
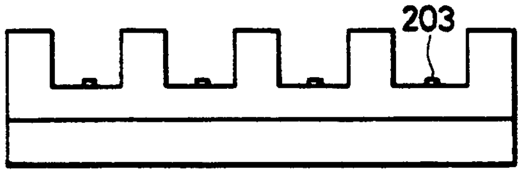
Figure 6C:
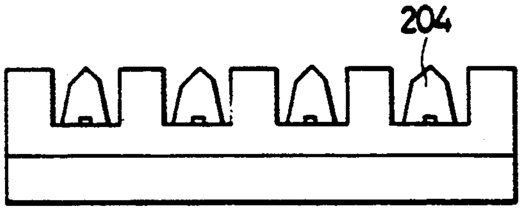
Figure 6D:
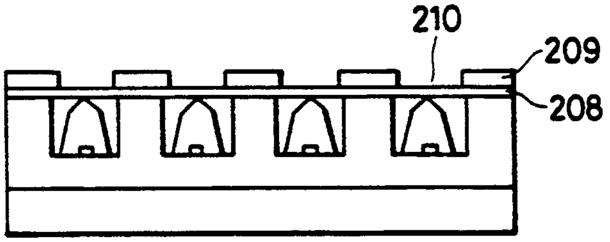

As shown in FIGS. 6B and 6C, nucleus formation bases 203 and electrodes 204 having conical portions and a desired size are formed in the same manner as in FIGS. 4A and 4B. As shown in FIG. 6D, a resist is filled in the recesses 202 and a metal layer 208 such as an Mo layer is formed on the resist and oxide substrate 201. A photoresist 209 is coated on the metal layer 208 and exposed and etched to form openings 210.

Figure 6E:
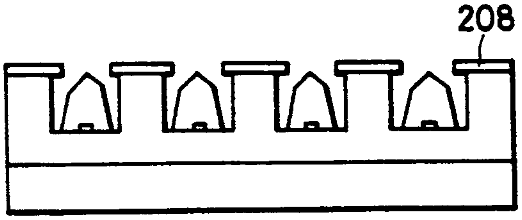

Finally, as shown in FIG. 6E, the metal layer 208 are etched to form openings and the resist pattern is removed to prepare a multi electron emission element.

If the metal layer 208 is divided into strips to constitute a matrix electrode structure in the same manner as in the metal plates $205_1$ to $205_4$ shown in FIG. 7, a matrix type multi electron emission element can be prepared.

In the above embodiment, the electrode 204 with the conical portion is determined by the conditions such as the oxide substrate 201 (oxide film 201*a*) constituting the deposition surface, the nucleus formation bases 203, the material of the deposition material, and the deposition conditions. The size of the conical portion can be determined independently of the sizes of the recesses 202 and the openings 210, thereby preventing dimensional variations caused by variations in sizes of the recesses 202 and the openings 210. The position of the electrode 204 with a conical portion can be determined by the position of the corresponding nucleus formation base 203. The electrode 204 can be formed at a desired position with high precision. As a result, a plurality of electron emission ports of the multi type electron emission element can be formed at fine pitches with uniformity.

Since the single crystal can be easily formed using the nucleus formation base as its center (to be described later), wide material selection can be allowed without considering crystallinity or the like between the deposition material and the deposition surface. For example, unlike in the conventional case wherein it is difficult to grow a single crystal on an insulating substrate such as an amorphous substrate, a single crystal can be formed on the insulating substrate, and a large element area can be assured. Therefore, the method of the present invention is very effective to prepare a multi type electron emission element. In addition, the shapes of the conical portions as electron emission portions can be uniformly and sharply formed to obtain a high field intensity. Therefore, variations in initial operating voltages can be prevented, and electron emission efficiency can be further improved.

As shown in FIG. 6, the deposition surface can be formed on an underlying substrate of a desired material. For example, a deposition surface is formed on a substrate having high heat dissipation efficiency, and circuit reliability can be greatly improved.

It is easy to prepare an electrode with a conical portion by using a single crystal according to the above method. The conductivity of the electrode with the conical portion can be improved. The electron emission portion as the conical portion can be matched with the crystal surface of a predetermined structure to improve a Schottky effect and electron emission efficiency. At the same time, a plurality of electrodes each with a conical portion are formed on the deposition surface of the insulating material, thereby improving electrical insulation. Therefore, crosstalk between the adjacent electrodes can be prevented.

A method of growing a single crystal on a deposition surface will be described below.

A method of selectively depositing a film on the deposition surface will be described below. Selective deposition is a method of selectively forming a thin film on a substrate by utilizing differences of factors between the materials which determine nucleus formation. These factors are surface energy, deposition coefficients, elimination coefficients, surface diffusion rates, and the like, all of which are associated with thin-film formation process.

Figure 8A:
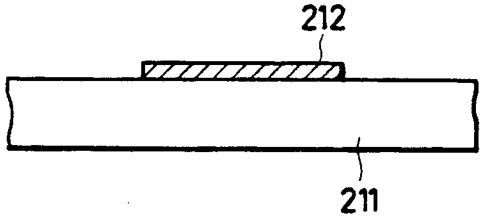
FIG. 8A and 8B are views for explaining selective deposition.
Figure 8B:
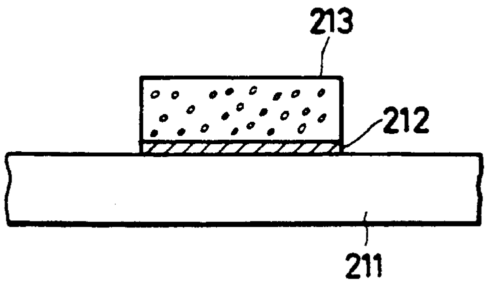

FIGS. 8A and 8B are views for explaining selective deposition.

As shown in FIG. 8A, a thin film 212 having different factors than those of a substrate 211 is formed thereon at a desired portion. When deposition of a thin film made of a proper material under proper deposition conditions is performed, a thin film 213 is formed on only the thin film 212, as shown in FIG. 8B, but the thin film 213 is not formed on other regions of the substrate 211. By utilizing this phenomenon, the thin film 213 can be grown in a self-aligned manner. Unlike the conventional process, photolithography techniques using a resist can be omitted.

Materials subjected to selective deposition are $SiO_2$ for forming the substrate 211, Si, GaAs, or silicon nitride for forming the thin film 212, and Si, W, GaAs, or InP for forming the thin film 213.

Figure 9:
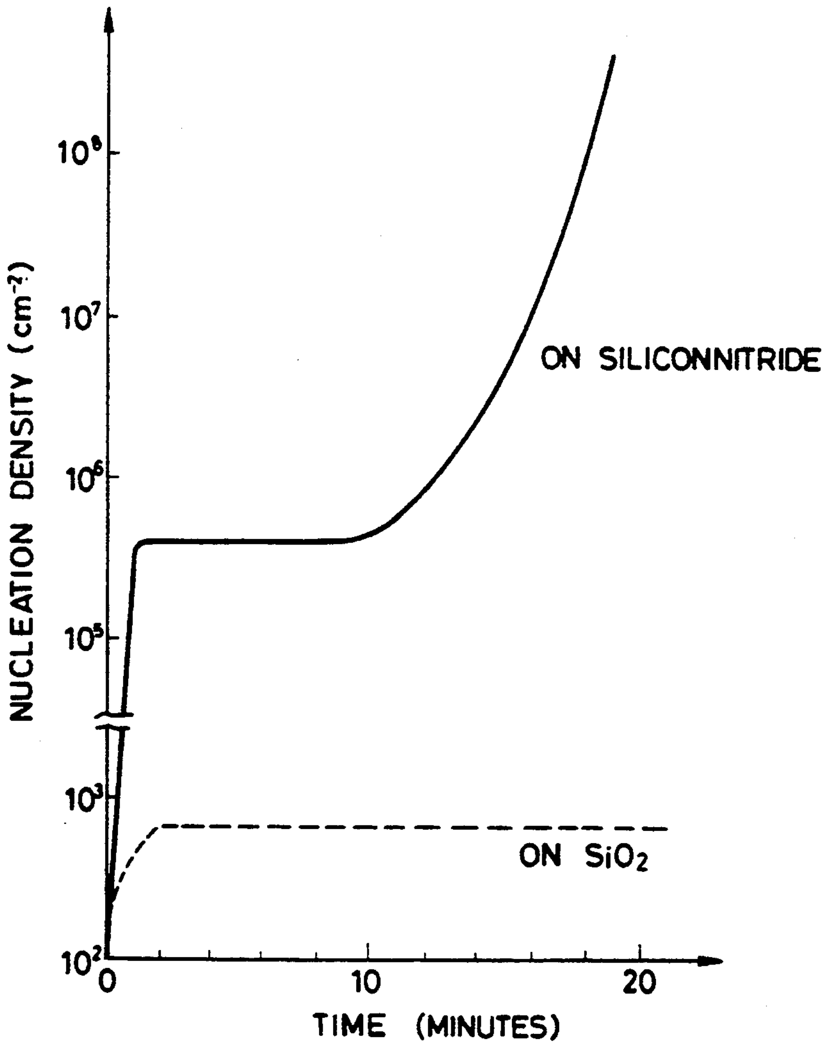
FIG. 9 is a graph showing changes in nucleation densities of the deposition surfaces of $SiO_2$ and silicon nitride as a function of time.

FIG. 9 is a graph showing changes in nucleation densities and the deposition areas of $SiO_2$ and silicon nitride as a function of time.

As is apparent from the above graph, the nucleation density on $SiO_2$ is saturated below $10^3$ $cm^{-2}$ immediately after the deposition and is kept substantially unchanged after 20 minutes.

However, the nucleation density on silicon nitride ($Si_3N_4$) is temporarily saturated at $\sim 4\times 10^5$ $cm^{-2}$ and is not changed within 10 minutes. However, subsequently, the nucleation density is rapidly increased. In this measurement, the films were deposited by CVD at a pressure of 175 Torr and a temperature of 1,000° C. in an atmosphere where $SiCl_4$ gas is diluted with $H_2$ gas. In addition, $SiH_4$, $SiH_2Cl_2$, $SiHCl_3$, or $SiF_4$ gas may be used as a reaction gas, and the pressure, temperature and the like are controlled to obtain the same effect as described above. The above deposition may be performed by vacuum deposition.

In this case, a nucleus is formed on $SiO_2$ without problems. By adding HCl gas into the reaction gas, nucleus formation on $SiO_2$ is further suppressed to prevent formation of $SiO_2$ on Si.

The above phenomenon depends on differences between the adsorption coefficients, the elimination coefficients, and the surface diffusion coefficients of Si and those of $SiO_2$ and silicon nitride. Si atoms are reacted with $SiO_2$ to produce silicon monoxide (SiO) having a high vapor pressure. $SiO_2$ itself is etched by silicon monoxide. Such an etching phenomenon does not occur on silicon nitride (T. Yonehara, S. Yoshioka, and S. Miyazawa, Journal of Applied Physics 53, 6839, 1982).

If materials for the deposition surface are selected as $SiO_2$ and silicon nitride, and a deposition material is selected as silicon, a sufficiently high nucleation density difference can be obtained as shown in the graph in FIG. 9. $SiO_2$ is preferable as a material for the deposition surface. However, even if $SiO_x$ is used, a satisfactory nucleation density difference can be obtained.

The materials are not limited to the ones described above. The sufficient nucleation density difference is $10^2$ times or more the nucleation density, as is apparent from FIG. 9. Materials to be exemplified later can be used to satisfactorily form deposition films.

Another method of obtaining the above nucleation density difference is to form a region containing an excessive amount of Si and N by locally ion-implanting Si and N on $SiO_2$.

By utilizing the above selective deposition method and preparing a sufficiently fine heterogeneous material pattern having a sufficiently high nucleation density than that of the material of the deposition surface so as to allow growth of only the single nucleus, a single crystal can be grown at a position where the fine heterogeneous material pattern is present.

Since selective growth of the single crystal is determined by electron state on the deposition surface, and in particular a dangling bond state, a material having a low nucleation density (e.g., $SiO_2$) need not be a bulk material but may be formed on any material or a substrate, thereby constituting only the deposition surface.

Figure 10A:
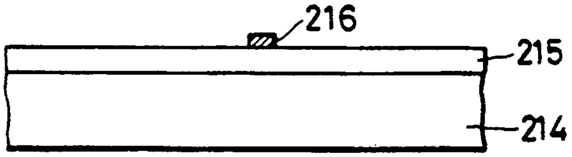
FIGS. 10A to 10C are views for explaining a method of forming a single crystal.
Figure 10B:
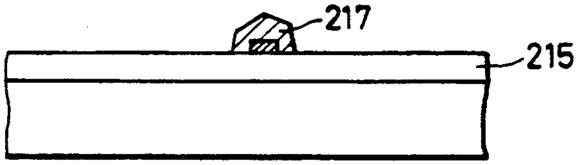
Figure 10C:
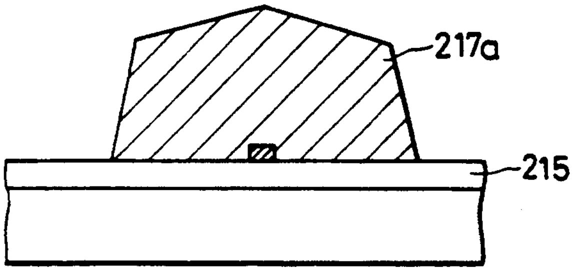
Figure 11A:
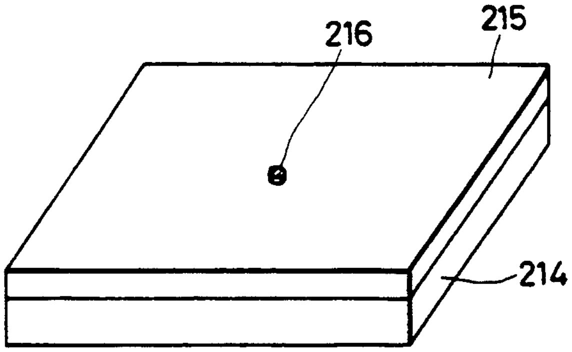
FIGS. 11A and 11B are perspective views of the substrate in FIGS. 10A and 10C, respectively.
Figure 11B:
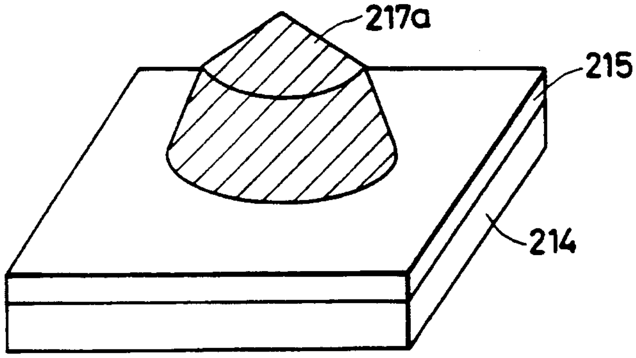

FIGS. 10A to 10C are views showing a method of forming a single crystal, and FIGS. 11A and 11B are perspective views of the substate of FIGS. 10A and 10B, respectively.

As shown in FIGS. 10A and 11A, a thin film 215 having a low nucleation density so as to allow selective deposition is formed on a substrate 214, and a heterogeneous material having a high nucleation density is formed on the thin film 215. These films are patterned by photolithography to obtain a pattern 216 of the heterogeneous material. The size and the crystal structure of the substrate 214 can be arbitrarily determined. A substrate having active elements can also be used. The heterogeneous material pattern 216 includes a denatured area containing an excess amount of Si and N and obtained by ion-implanting Si and N in the thin film 215.

A single nucleus of a thin film material is formed in only the heterogeneous material pattern 216 according to proper deposition conditions. That is, the heterogeneous material pattern 216 must be a micropattern enough to allow growth of only a single nucleus. The size of the heterogeneous material pattern 216 is less than several microns depending on the types of materials. The nucleus keeps the single crystal structure and grown as a single crystal island 217. In order to obtain the island 217, conditions for inhibiting nucleus formation on the thin film 215 must be determined.

The single crystal island 217 is further grown with the heterogeneous material pattern 216 as its center while maintaining the single crystal structure. As shown in FIG. 11C, a single crystal cone 217*a* is obtained.

Since the thin film 215 as a material of the deposition surface is formed on the substrate 214, the substrate 214 as a support target can be formed by any material. In addition, even if the substrate 214 has active elements and the like, a single crystal can be easily formed thereon.

In the above embodiment, the material for the deposition surface is selected as the thin film 215. However, a substrate made of a material having a low nucleation density which allows selective deposition may be used without modification, and a single crystal may be formed in the manner described above.

Figure 12A:
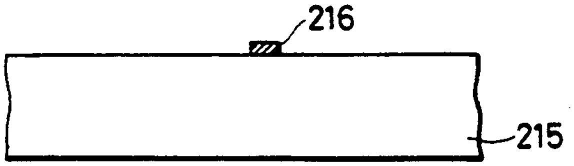
FIGS. 12A to 12C are views for explaining another method of forming a single crystal.
Figure 12B:
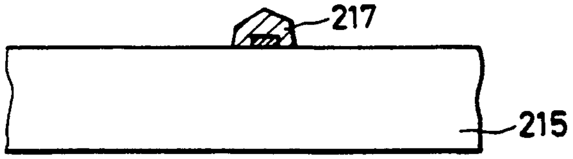
Figure 12C:
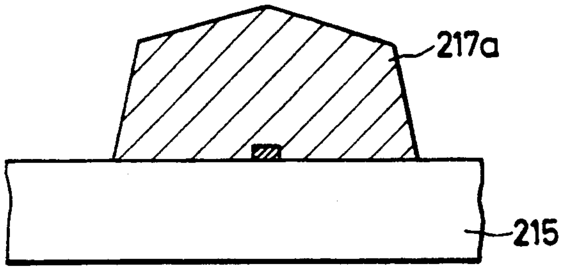

FIGS. 12A to 12C are views for explaining another method of forming a single crystal.

As shown in FIGS. 12A to 12C, a heterogeneous material 216 is micropatterned on a substrate 215 of a material having a sufficient low nucleation density and allowing selective deposition. A single crystal can be formed in the same manner as in FIG. 9.

(EXAMPLE)

A practical method of forming a single crystal will be described below.

$SiO_2$ is used as a deposition surface material for a thin film 215. In this case, a quartz substrate may be used. Alternatively, an $SiO_2$ film may be formed on a substrate of a metal, a semiconductor, a magnetic material, a piezoelectric material, or an insulating material by sputtering, CVD, or vacuum deposition. $SiO_2$ is preferable as the deposition surface material. However, $SiO_x$ may be used wherein x is variable.

A silicon nitride layer ($Si_3N_4$ layer) or a polycrystalline silicon layer as a heterogeneous material is deposited on the $SiO_2$ layer 215 by low-pressure epitaxy. The silicon nitride layer or the polycrystalline silicon layer is patterned with a conventional photolithographic technique or a photolithographic technique using an X-ray, an electron beam, or an ion beam, thereby obtaining a heterogeneous material micropattern 216 having a size of several microns or less and preferably $\sim 1$ $\mu m$ or less.

Subsequently, by using a gas mixture of HCl, $H_2$, and $SiH_2Cl_2$, $SiCl_4$, $SiHCl_3$, $SiF_4$, or $SiH_4$, Si is selectively grown on the substrate 214. In this case, the substrate temperature is 700° to 1,100° C. and a pressure is about 100 Torr.

Within a period between 10 minutes and 20 minutes, single crystal Si 217 is grown by using as its center the heterogeneous material micropattern 216 of silicon nitride or polycrystalline silicon. By setting optimal growth conditions, the size of the Si 217 is increased from the size of the heterogeneous material to several tens of microns of single crystal 217*a*.

(Composition of Silicon Nitride)

In order to obtain a sufficiently high nucleation density difference between the deposition surface material and the heterogeneous material as described above, the material is not limited to $Si_3N_4$. The composition of silicon nitride may be changed.

In plasma CVD wherein $SiH_4$ gas and $NH_3$ gases are decomposed in an RF plasma to obtain a silicon nitride film at a low temperature, a flow rate ratio of $NH_3$ gas to $SiH_4$ gas is changed to greatly change the composition ratio of Si to N contained in a silicon nitride film to be deposited.

Figure 13:
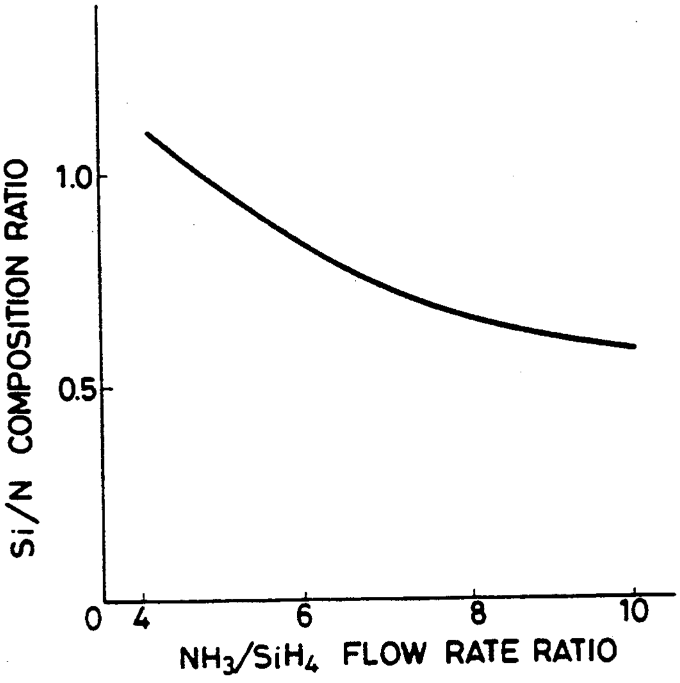
FIG. 13 is a graph showing the relationship between the flow rate ratio of $NH_3$ to $SiH_4$ and the composition ratio of Si to N in the formed silicon nitride film.

FIG. 13 is a graph showing the relationship between the Si/N composition and the $NH_3/SiH_4$ flow rate ratio.

The deposition conditions for the graph in FIG. 13 are given as follows: an RF output was 175 W; a substrate temperature was 380° C.; and an $SiH_4$ gas flow rate was fixed to be 300 cc/min while the $NH_3$ gas flow rate was changed. When the $NH_3/SiH_4$ gas flow rate ratio is changed to 4 to 10, the Si/N composition in the silicon nitride film is changed to 1.1 to 0.58 according to the Auger electrospectoscopy.

The composition of the silicon nitride film formed under the conditions that $SiH_2Cl_2$and $NH_3$ gases were used at a low pressure of 0.3 Torr at a temperature of about 800° C. was similar to $Si_3N_4$ (S1/N=0.75) as a stoichiometrical ratio.

A silicon nitride film prepared by heating Si in ammonia or $N_2$ at a temperature of about 1,200° C. (thermal nitrification) has a composition similar to a stoichiometrical ratio since film formation is performed in a thermal equilibrium state.

When the Si nucleus is grown by using silicon nitride as a deposition surface material having a higher nucleation density than that of Si, a nucleation density difference occurs due to its composition ratio.

Figure 14:
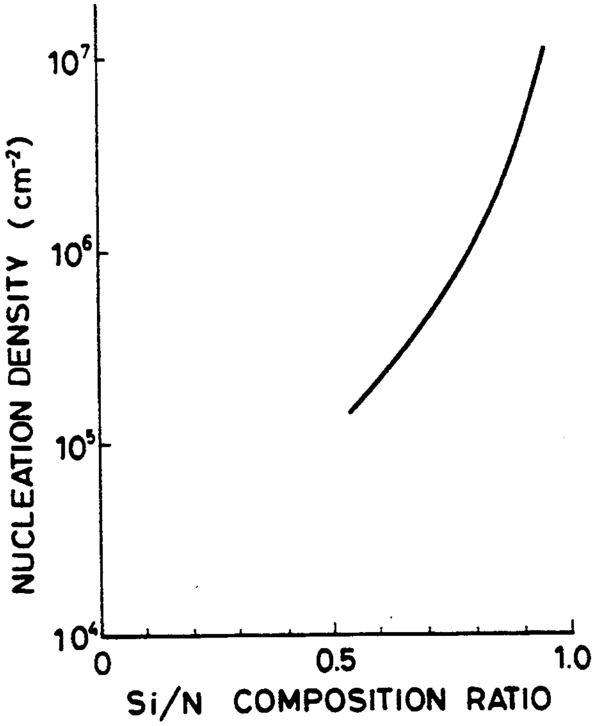
FIG. 14 is a graph showing the Si/N composition ratio and the nucleation density.

FIG. 14 is a graph showing the relationship between the Si/N composition ratio and the nucleation density. As is apparent from this graph, when the composition of the silicon nitride film is changed, the Si nucleation density grown on the silicon nitride film is greatly changed. In this case, the nucleation conditions are given such that the pressure of $SiCl_4$ gas reduced to 175 Torr and $SiCl_4$ is reacted with $H_2$ at 1,000° C., thereby producing Si.

The phenomenon in which the nucleation density is changed by the silicon nitride composition greatly influences the pattern size of silicon nitride as the heterogeneous material pattern which is formed to be sufficiently fine enough to allow growth of the single nucleus. That is, unless silicon nitride having a composition for a high nucleation density is finely patterned, a single nucleus cannot be formed.

The nucleation density and the optimal silicon nitride pattern size for selecting the single nucleus must be selected. In deposition conditions for obtaining a nucleation density of, e.g., $10^5$ $cm^{-2}$, selection of a single nucleus is allowed by the silicon nitride size of 4 m or less.

(Formation of Heterogeneous Material by Ion Implantation)

In order to obtain a large nucleation difference for Si, N, P, B, F, Ar, He, C, As, Ga, Ge ions or the like can be locally implanted on the surface of the layer of $SiO_2$ as a deposition surface material having a low nucleation density to form a denatured region on the $SiO_2$ deposition surface. This denatured region may serve as a deposition surface material having a high nucleation density.

For example, a resist is formed on the surface of the $SiO_2$ layer and is exposed with a desired mask pattern, developed and dissolved to partially expose the surface of the $SiO_2$ layer.

Subsequently, $SiF_4$ gas is used as a source gas, and Si ions are implanted in $SiO_2$ at a dose of $1\times10^{16}$ to $1\times10^{18}$ $cm^{-2}$ and an acceleration voltage of 10 keV. The projection range is 114 Å. The concentration of Si reaches $\sim10^{22}$ $cm^{-3}$ on the surface of the $SiO_2$ layer. The region doped with ions is amorphous.

In order to form a denatured region, ions may be implanted using a resist as a mask. By using focused ion beam technique, a focused Si ion beam may impinge on the surface of the $SiO_2$ layer without using a resist mask.

After ion implantation is completed, the resist pattern is removed to form a denatured region containing an excessive amount of Si on the $SiO_2$ surface. Si is then epitaxially grown on the $SiO_2$ deposition surface having the denatured region.

Figure 15:
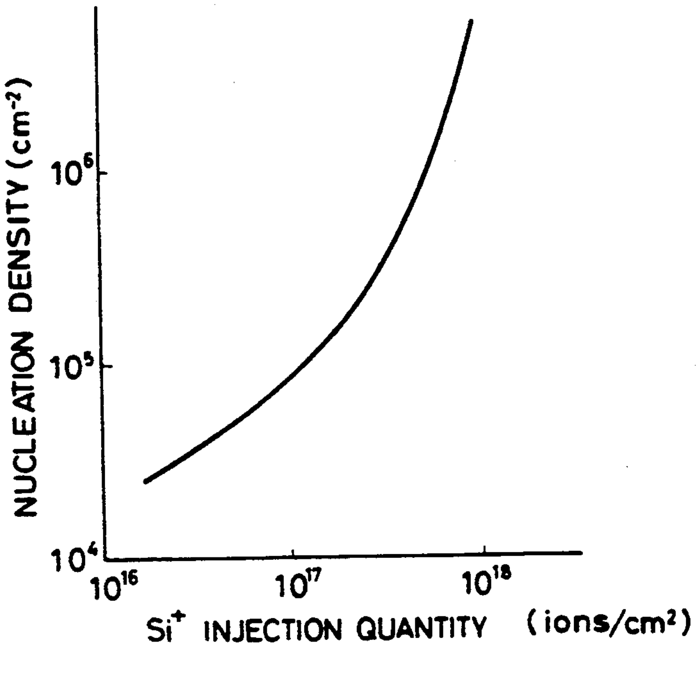
FIG. 15 is a graph showing the relationship between the Si ion doping amount and the nucleation density.

FIG. 15 is a graph showing the injection quantity of Si ions and the nucleation density.

As is apparent from FIG. 15, when the injection quantity of $Si^+$ is increased, the nucleation density is increased accordingly.

By forming the sufficiently fine denatured region, the denatured region can serve as a heterogeneous material for allowing growth of a single nucleus. As a result, a single crystal can be grown as described above.

Formation of sufficiently fine denatured region, i.e., micropatterning, can be achieved by a resist pattern or a focused ion beam spot.

(Si Deposition Methods Excluding CVD)

In addition to CVD for forming a single crystal by utilized Si nucleus formation, another method can be utilized wherein Si is evaporated by an electron gun in a vacuum ($<10^{-6}$ Torr) and is deposited on a heated substrate). In particular, MBE (Molecular Beam Epitaxy) for depositing Si in a high vacuum ($<10^{-9}$ Torr), the Si ion beam is reacted with $SiO_2$ at a substrate temperature of 900° C., and no Si nucleus is formed on $SiO_2$ (T. Yonehara, S. Yoshioka, and S. Miyazawa, Journal of Applied Physics, 53, 10, P. 6839, 1983).

Single Si nuclei were perfectly and selectively formed in silicon nitride micropatterns sprinkled on $SiO_2$ by utilizing the above phenomenon and single crystal Si was grown. In this case, the deposition conditions were as follows: the vacuum was $10^{-8}$ Torr or less; the Si beam intensity was $9.7\times10^{14}$ atoms/$cm^2$.sec; and the substrate temperature was 900° C. to 1,000° C.

In this case, a reactive product as SiO having a very high vapor pressure is formed by a reaction $SiO_2$+-Si→2SiO↑. $SiO_2$ itself is etched by Si by this evaporation.

However, no etching phenomenon occurs on silicon nitride, and nucleus formation and deposition occur.

In addition to silicon nitride as a deposition surface material having a high nucleation density, a tantalum oxide ($Ta_2O_5$), a silicon nitride-oxide (SiON), or the like can be used to obtain the same effect as described above. These materials can be finely formed and serve as the heterogeneous material, so that a single crystal can be grown using the heterogeneous material as its center.

(Growth of Tungsten Single Crystal)

Tungsten is used in place of Si.

Tungsten nucleus formation does not occur on $SiO_2$, but tungsten can be deposited as a polycrystalline film on Si, $WSi_2$, PtSi, Al, or the like. However, according to the method of forming a single crystal according to the present invention, the single crystal can be easily grown.

More specifically, Si, $WSi_2$, PtSi, or Al is deposited on glass, quartz or a thermal oxide film containing $SiO_2$ as a major constituent in a vacuum and is patterned by photolithography to obtain a micropattern having a size of several microns or less.

Subsequently, the resultant structure is placed in a reaction furnace heated to 250° to 500° C. A gas mixture of $WF_6$ and $H_2$ gases is supplied to the furnace at a pressure of about 0.1 to 10 Torr. In this case, the flow rate of $WF_6$ is 75 cc/min, and the flow rate of $H_2$ is 10 cc/min.

Tungsten is produced as represented by reaction formula $WF_6+3H_2 \rightarrow W+6HF$. In this case, tungsten is rarely reacted with $SiO_2$, and strong bonds are not formed therebetween. Therefore, nucleus formation does not occur and film deposition does not occur accordingly.

A tungsten nucleus is formed on Si, $WSi_2$, PtSi, or Al. In this case, only single tungsten nuclei are formed. Such a nucleus continuously grows on $SiO_2$ in the lateral direction to a single crystal region because tungsten is not subjected to nucleus growth and cannot be grown as a polycrystal.

Combinations of the deposition surface materials, the heterogeneous materials, and deposition materials are not limited to the ones exemplified in the above embodiments. Any combination can be employed if a sufficient high nucleation density difference can be obtained. A single crystal can be formed in the case of a compound semiconductor such as GaAs or InP subjected to selective deposition according to the present invention.

In the multi type electron emission element according to the embodiment as described above in detail, the plurality of electrodes each having a conical portion formed on the deposition surface is made of a single crystal. The conductivity of the electrode with the conical portion can be improved. The electron emission portion as the conical portion is matched with the crystal surface having a predetermined structure, thereby improving the Schottky effect and electron emission efficiency. In addition, the plurality of electrodes each with a conical portion are formed on the deposition surface consisting of an insulating material, so that electrical insulation can be improved and crosstalk between the adjacent electrodes can be prevented.

According to the method of manufacturing the above multi type electron emission element, the single crystal can be deposited on a material which cannot conventionally allow the growth of the single crystal thereon due to crystallinity or the like. The selection range of the single crystal materials can be greatly widened, and a large area of a single crystal can be obtained. In addition, the shapes of the electron emission portions can be uniform and sharp to obtain a higher field intensity. Variations in initial operating voltage can be prevented, and electron emission efficiency can be further improved.

Furthermore, the position of the electrode with the conical portion can be determined by the position of the fine heterogeneous material pattern and can be arbitrarily determined. In addition, the shapes of the plurality of electrodes each with the conical portion can be determined by the conditions such as the materials of the constituting targets and deposition conditions. The size of the electrode with the conical portion can be easily controlled, and the dimensional variations can be minimized. As a result, the plurality of electron emission ports of the multi type electron emission elements can be formed at fine pitches with uniformity.

According to the method described above, the deposition surface can be formed on an underlying substrate of a desired material, thus improving element reliability.

FIGS. 16A to 16D are schematic partial sectional views for explaining the steps in manufacturing an electron emission element according to still another method of the present invention.

Figure 16A:
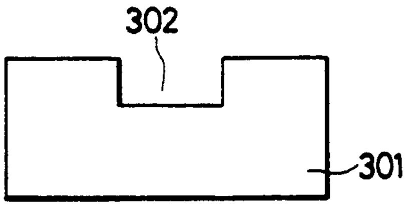
FIGS. 16A to 16D are schematic partial sectional views for explaining the steps in manufacturing an electron emission element according to another method of the present invention.

As shown in FIG. 16A, an oxide substrate 301 of $SiO_2$ as an amorphous insulating material is photoetched to form a recess 302.

Figure 16B:
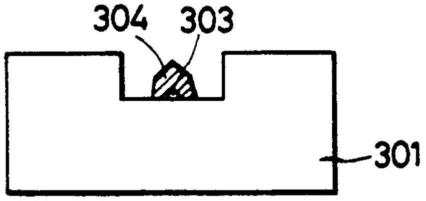

As shown in FIG. 16B, a single crystal of Mo, W, Si, or the like is grown with a single nucleus as its center in a nucleus formation base 303 of Si, $Si_3N_4$ or the like on the bottom surface (i.e., a deposition surface) of the recess 302. An electrode 304 with a conical portion having a desired size is formed. A method of forming the single crystal will be described later. In this embodiment, the bottom surface of the recess 302 of the oxide substrate 301 serves as the deposition surface, and the side wall surface of the recess 302 serves as an insulating member. The insulating member may be formed on the deposition surface in a separate process using the same material as that of the deposition surface or a material different therefrom.

Figure 16C:
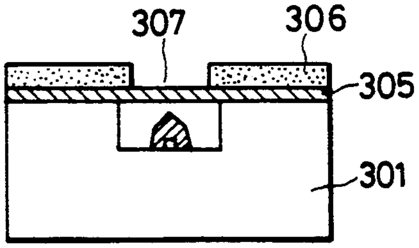

As shown in FIG. 16C, a resist is filled in the recess 302, and a metal layer 305 such as an Mo layer is formed on the resist and the oxide substrate 301. In addition, a photoresist 306 is applied to the metal layer 305, exposed with light and etched in this photoetching process, thereby forming an opening 307.

Figure 16D:
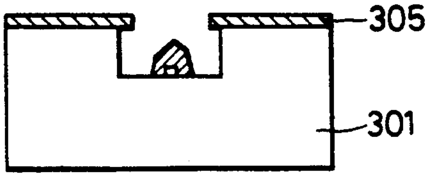

Finally, as shown in FIG. 16D, an opening is formed in the metal layer 305 by etching, and a metal layer 305 serving as a deriving electrode is formed. The resist pattern is removed, and an electron emission element is thus prepared.

In the above method, the electrode with the conical portion is formed on the oxide substrate 301. However, an oxide film **301*a*** may be formed on an underlying substrate to prepare an electron emission element in the same manner as described above.

Figure 17:
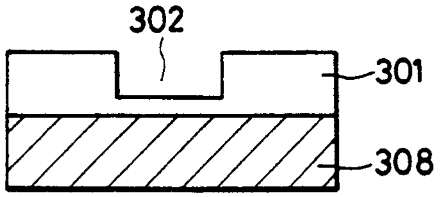
FIG. 17 is a schematic partial sectional view for explaining the step in manufacturing an electron emission element according to the method of FIGS. 16A to 16D.

FIG. 17 is a schematic partial sectional view of an electron emission element according to the method of FIGS. 16A to 16D.

As shown in FIG. 17, an oxide film **301*a* is formed on an underlying substrate 308 of Si, and a recess 302 is formed in the oxide film 301*a*, thereby forming the electron emission element on the Si underlying substrate. The subsequent steps are the same as those in FIGS. 16B to 16D**, and a description thereof will be omitted.

Figure 18:
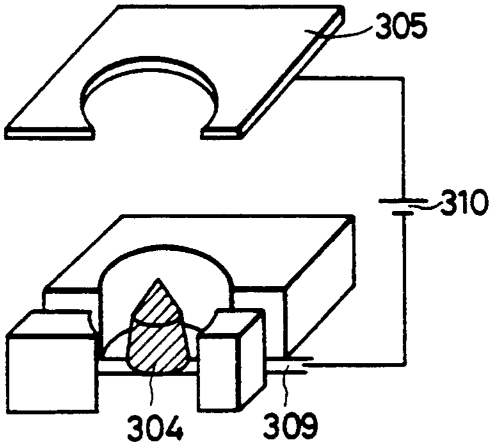
FIG. 18 is a schematic perspective view for explaining wiring of the electron emission element described above.

FIG. 18 is a schematic perspective view for explaining a wiring pattern of the electron emission element shown in FIGS. 16A to 17.

As shown in FIG. 18, in the electron emission elements manufactured in FIGS. 16A to 17, a connection terminal is formed such that an electrode 304 with a conical portion is formed on the bottom surface of the recess 302, a groove is formed in the oxide substrate 301 or an oxide film 301*a*, and a wiring layer 309 is formed in the groove. The connecting terminal is connected to the electrode 304 with the conical portion. A voltage is applied from a power source 310 to a junction between the wiring layer 309 and the metal layer 305 to cause electron emission. In the above embodiment, the metal layer such as an Mo layer is formed as the deriving electrode during the process. However, a metal plate having an opening may be adhered to the oxide substrate 301 or the oxide film 301*a* after the groove is formed.

In the method described in FIGS. 16A to 17, the electrode 304 with the conical portion is determined by conditions such as the oxide substrate 301 (oxide film 301*a*) constituting the deposition surface, the nucleus formation base 303, the material of the deposit, and the deposition conditions. The electrode with the conical portion can be formed independently of the sizes of the recess 302 and the opening 307. Therefore, variations in electrode size can be prevented. The position of the electrode 304 with the conical portion is determined by the position of the nucleus formation base 303. Therefore, the electrode 304 with the conical portion can be formed at a desired position.

Since the single crystal can be formed with the nucleus formation base 303 as its center (the details will be described later), wide material selection is allowed without considering crystallinity or the like between the deposition material and the deposition surface. For example, unlike in the conventional case, a single crystal can be formed on an amorphous substrate, and perfect electrical insulation is also allowed. A large area of a single crystal is assured. In addition, the shapes of the electron emission portions as the conical portions can be made uniform and sharp to obtain a higher field intensity. Variations in initial operating voltage can be prevented and electron emission efficiency can be further improved.

As shown in FIG. 17, the deposition surface can be formed on an underlying substrate of a desired material. For example, the deposition surface is formed on a substrate having high heat dissipation efficiency, and therefore, element reliability can be improved.

According to the above method, the electrode with the conical portion can be easily manufactured, and the conductivity of the electrode with the conical portion can be improved. The electron emission portion as the conical portion can be matched with the crystal surface having a predetermined structure. The Schottky effect and electron emission efficiency can be improved.

A method of growing a single crystal on a deposition surface will be described below.

Selective deposition for selectively depositing a film on the deposition surface will be described. Selective deposition is a method of selectively forming a thin film on a substrate by utilizing differences of factors of the materials. These factors includes surface energy, deposition coefficients, elimination coefficients, surface diffusion rates and determine formation of the nucleus during the thin film formation process.

As described above, according to the above electron emission element, the electrode having a conical portion thereon and formed on the deposition surface can consists of a single crystal. The conductivity of the electrode with the conical portion can be improved. In addition, the electron emission portion as a conical portion can be matched with the crystal surface having a predetermined structure, thereby improving the Schottky effect and electron emission efficiency.

According to the method of manufacturing the above electron emission element, unlike in the conventional case, a single crystal can be formed on a substrate which does not allow formation of the single crystal thereon due to crystallinity or the like. Therefore, the single crystal material selection range can be widened. By properly selecting the material of the substrate, the single crystal can be perfectly electrically insulated from the substrate. A large area of the single crystal can be assured. The shapes of the electron emission portions can be made uniform and sharp to obtain a higher field intensity. Therefore, variations in initial operating voltage can be suppressed, and electron emission efficiency can be further improved.

Since the position of the electrode with the conical portion can be determined by the position of the fine heterogeneous material pattern, the electrode with the conical portion can be precisely formed at a desired position. The shape of the electrode with the conical portion can be determined by conditions such as the materials of the constituting targets and the deposition conditions. The size of the electrode can be easily controlled. Variations in size of the electrode can be prevented. As a result, the plurality of electron emission ports of the multi type electron emission element can be formed at fine pitches with uniformity.

According to the above method, the deposition surface can be formed on an underlying substrate of a desired material. For example, the deposition surface is formed on a substrate having high heat dissipation efficiency, and element reliability can be improved.

FIGS. 19A to 19F are schematic partial sectional views for explaining the steps in manufacturing an electron emission element according to still another method of the present invention.

Figure 19A:
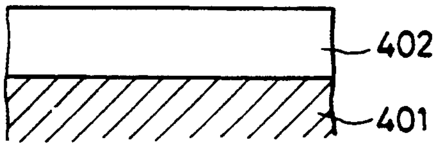
FIGS. 19A to 19F are schematic partial sectional views for explaining the steps in manufacturing an electron emission element according to still another method of the present invention.

As shown in FIG. 19A, an insulating layer 402 consisting of an insulating material such as $SiO_2$ is formed on a substrate 401 consisting of a conductive material (including a semiconductor) such as Si.

Figure 19B:
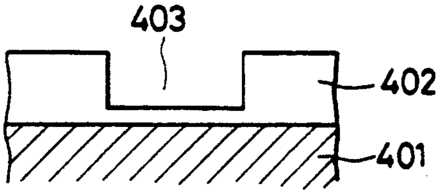

As shown in FIG. 19B, a recess 403 is formed in the insulating layer 402 by photoetching.

Figure 19C:
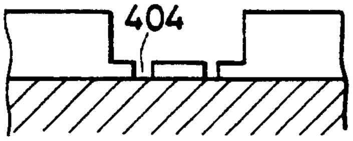

As shown in FIG. 19C, an opening 404 is formed in the bottom surface of the recess 403 in the insulating layer 402.

Figure 19D:
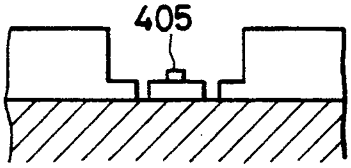

As shown in FIG. 19D, a nucleus formation base 405 as a heterogeneous material such as Si or $Si_3N_4$ is micropatterned on the bottom surface of the recess 403.

Figure 19E:
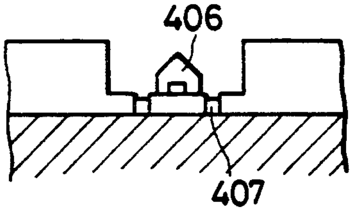

As shown in FIG. 19E, a single crystal 406 such as an Mo, W, or Si single crystal is formed with a single nucleus as its center formed in the nucleus formation base 405. A method of forming this single crystal will be described later. When the single crystal 406 is grown, a single crystal 407 is simultaneously grown on the exposed portion of the conductive material in the opening 404.

Figure 19F:
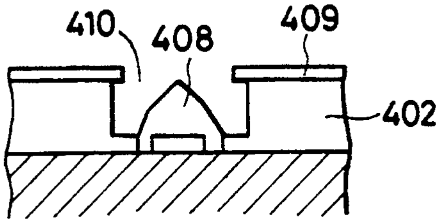

As shown in FIG. 19F, the single crystal 406 is grown and connected to the single crystal 407, thereby forming an electrode 408 with a conical portion 408.

Deposition coefficients of single crystal atoms of the material of the single crystal 406, the material of the nucleus formation base 405, the conductive material of the substrate 401, and the material of the insulating layer 402 are given as K, L, M, and N. The following condition must be satisfied:

$K>L>M>N$

If the conductive material of the substrate 401 is a material satisfying condition $L>M$, the single crystal 406 is grown with the nucleus formation base 405, and then the single crystal 407 is grown from the opening 404. The single crystal 406 can be grown with a conical shape unique to the single crystal. After the single crystal 406 is connected to the single crystal 407, the crystal 406 is continuously grown while keeping the shape of the conical portion.

However, if condition $K>M>L>N$ is given and the conductive material of the substrate 401 is a material satisfying condition $L<M$, the single crystal in the opening 404 is grown first. Therefore, it is difficult to form the single crystal 406 with a conical portion while being centered on the single nucleus formed in the nucleus formation base 405. In this case, growth of the single crystal 407 must be suppressed. For example, the opening 404 must be a hole having a very small diameter and the thickness of the insulating layer is increased, thereby reducing the number of single crystal atoms reaching the surface of the exposed conductive material. Alternatively, the opening 404 must be filled with a resist until the single crystal 406 reaches a predetermined size. Thereafter, the single crystal 407 is grown.

Finally, an electrode layer such as an Mo layer is formed on the insulating layer 402 and is patterned by photolithography to form an opening 410 above the conical portion of the electrode 408, and an electrode layer 409 serving as a deriving electrode is formed, thereby preparing an electron emission element.

The crystal formed on the conductive material surface is exemplified by a single crystal. However, this embodiment is also applicable to a polycrystal.

In the electron emission element manufactured by the method described above, the electrode with the conical portion is connected to the conductive material surface through the opening formed in the insulating layer. Therefore, a wiring density and hence a packing density of the element can be increased, and element reliability can be improved.

According to the above method in this embodiment as described above, the electrode with the conical portion is connected to the conductive material surface as follows. That is, the crystal is deposited on the exposed conductive material surface in the opening formed in the insulating layer. The electrode with the conical portion of the crystal grown centered on the single nucleus formed in the fine heterogeneous material pattern connected to the conductive material surface. In this case, additional connection process can be omitted and a simple electrical connection can be facilitated.

The sufficiently fine heterogeneous material pattern having a sufficiently higher nucleation density than that of the material of the insulating layer and allowing the growth of only the single nucleus is formed on the insulating layer. The single crystal is grown centered on the single nucleus grown in the heterogeneous material pattern. According to this method, the electrode 408 with the conical portion is determined by conditions such as the insulating layer 402 constituting the deposition surface, the nucleus formation base 405, the material of the deposit, and the deposition conditions. The electrode 408 can be formed independently of the sizes of the recess 403 and the opening 410 of the electrode layer 409. Variations in sizes of the electrodes 408 can be suppressed. The position of the electrode 408 with the conical portion can be determined by the position of the nucleation formation base 405, and therefore the position of the electrode 408 can be arbitrarily determined with high precision. As a result, the plurality of electron emission ports of the multi type electron emission element can be determined at fine pitches with uniformity.

The shapes of the electron emission portions as conical portions can be made uniform and sharp to obtain a high field intensity. Variations in initial operating voltage can be suppressed and electron emission efficiency can be further improved.

Unlike in the conventional case, the single crystal can be deposited on the insulating layer which conventionally does not allow formation of the single crystal thereon due to crystallinity or the like. Electrical insulation can be greatly increased, and a large area of the single crystal can be assured. The conductivity of the electrode with the conical portion can be improved, and the electron emission portion as the conical portion can be matched with the crystal surface having a predetermined structure, thereby improving the Schottky effect and electron emission efficiency.

A method of forming the above single crystal on the insulating layer will be describe below.

Selective deposition for selectively forming a film on a deposition surface will be described below. Selective deposition is a method of selectively forming a thin film on a substrate by utilizing differences of factors of the materials. These factors are surface energy, deposition coefficients, elimination coefficients, and surface diffusion rates and determine nucleus formation during thin film formation.

According to the electron emission element as described above, the electrode with the conical portion is electrically connected to the conductive material surface through the opening formed in the insulating layer. The electrode with the conical portion can be electrically insulated from the substrate, and a wiring density and connection reliability can be improved.

According to the method of manufacturing the electron emission element described above, the electrode with the single crystal conical portion can be electrically connected to the conductive material surface in the following manner. The single crystal is deposited on the exposed conductive material surface in the opening formed in the insulating layer and is grown centered with the single nucleus formed in the fine heterogeneous material pattern. Therefore, the electrical connected between the electrode with the conical portion and the conductive material surface can be performed by an easy process.

Figure 20:
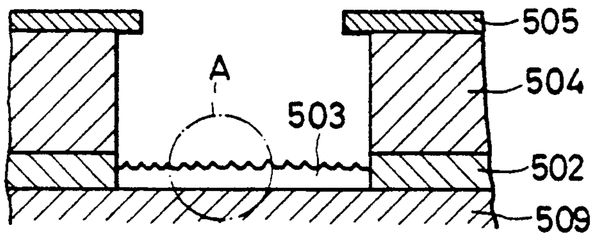
FIG. 20 is a schematic partial sectional view for explaining an electron emission element according to the present invention.

FIG. 20 is a schematic partial sectional view for explaining an electron emission element according to the present invention.

Figure 21:
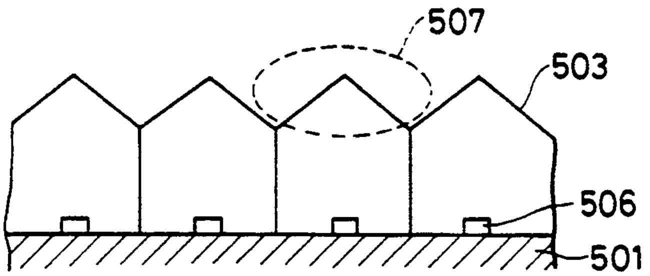
FIG. 21 is a partial enlarged view of the A portion of a high-resistance film in FIG. 20.

FIG. 21 is an enlarged sectional view of the A portion of a high-resistance film in FIG. 20.

As shown in FIGS. 20 and 21, a plurality of nucleus formation bases 506 of a heterogeneous material such as Si or $Si_3N_4$ is formed on an oxide substrate 501 consisting of an insulating material such as $SiO_2$. Single crystal regions of Mo, W, Si, or the like are grown centered on single nuclei formed in the nucleus formation bases 506, respectively. A plurality of high-resistance films 503 having conical portions 507 of a single crystal and a desired size are formed. The conical portions 507 of the high-resistance films 503 serve as electron emission portions, respectively. The nucleus formation bases 503 need not be equidistantly formed unlike in FIG. 21 and may be randomly formed. However, if the bases 503 are equidistantly formed, the projections of the high-resistance films 503 can be substantially uniform. A method of forming the single crystal regions will be described later. Electrodes 502*a* and 502*b* are formed at both ends of high-resistance films 503. An insulating layer 504 is formed on the electrodes 502*a* and 502*b* and the oxide substrate 501 such that an opening is formed at a position corresponding to high-resistance films 503. A deriving electrode 505 is formed on the insulating layer.

A resist is filled in the electron emission port above each high-resistance film 503 and a metal layer such as an Mo layer is formed on the resist pattern and the insulating film. The metal layer is photoetched to form an opening corresponding to each high-resistance film 503. The resist pattern is then removed to prepare an electron emission element.

In the method of manufacturing the above element, the plurality of high-resistance films 503 each with the conical portion 507 are formed on the oxide substrate 501. However, an oxide film may be formed on an underlying substrate, and the high-resistance film 503 may be formed thereon.

In the above embodiment, the deriving electrode 505 is formed during formation of the metal layer such as an Mo layer. However, a metal plate having an opening corresponding to each conical portion 507 may be adhered after the insulating layer 504 is formed.

In the electron emission element of the above embodiment, the conditions of forming the single crystal of the high-resistance film are determined by conditions of the oxide substrate 501 constituting the deposition surface, the nucleus formation base 506, the material of the deposit of the single crystal, and the deposition conditions. The identical conditions are assured for the single nuclei grown in the corresponding nucleus formation bases 506. Therefore, variations in the size of the high-resistance film can be prevented. The position of each conical portion is determined by the position of the corresponding nucleus formation base 506. Therefore, the conical portion can be formed at a desired position with high precision.

Since the single crystal region can be grown centered on the corresponding nucleus formation base 506 (details will be described later). Wide material selection can be assured without considering crystallinity or the like between the deposition material and the deposition surface. For example, a single crystal can be formed on an amorphous substrate which can rarely allows growth of the single crystal thereon. A large area of the single crystal can be assured.

In addition, the film with a conical shape unique to the single crystal can be formed. The shapes of the electron emission portions can be made uniform and sharp to obtain a higher field intensity. Variations in initial operating voltage can be suppressed, and electron emission efficiency can be improved. The electron emission portion as the conical portion can be matched with the crystal surface having a predetermined structure to improve the Schottky effect and electron emission efficiency.

The above element can be manufactured by the conventional semiconductor fabrication process and a high packing density can be achieved by simple fabrication steps.

When the deriving electrode is formed on the high-resistance film, the field intensity can be increased and electron emission efficiency can be improved.

A method of forming a single crystal on the deposition surface will be described below.

Selective deposition for selectively forming a film on a deposition surface will be described below. Selective deposition is a method of selectively forming a thin film on a substrate by utilizing differences of factors of the materials. These factors are surface energy, deposition coefficients, elimination coefficients, and surface diffusion rates and determine nucleus formation during thin film formation.

Figure 22A:
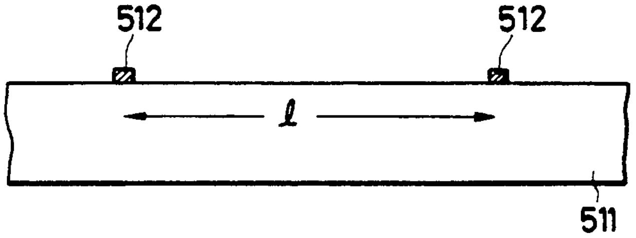
FIGS. 22A to 22C are views for explaining the steps in forming a single crystal according to a single-crystal formation method.
Figure 22B:
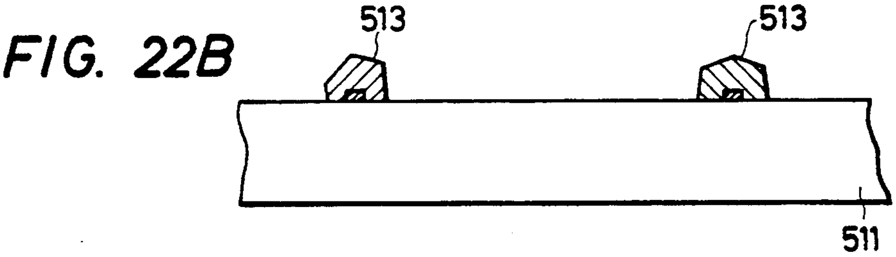
Figure 22C:
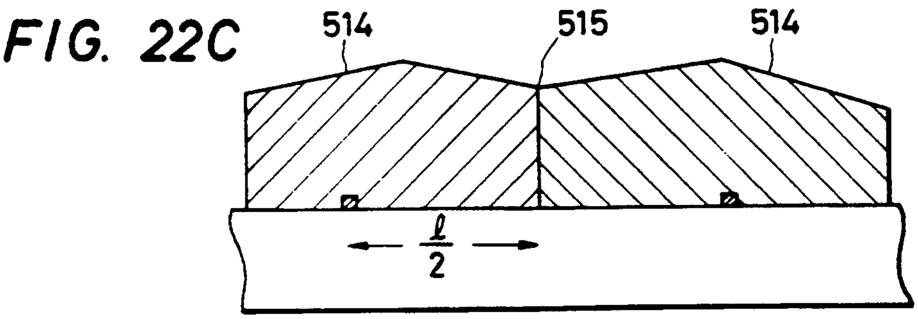
Figure 23A:
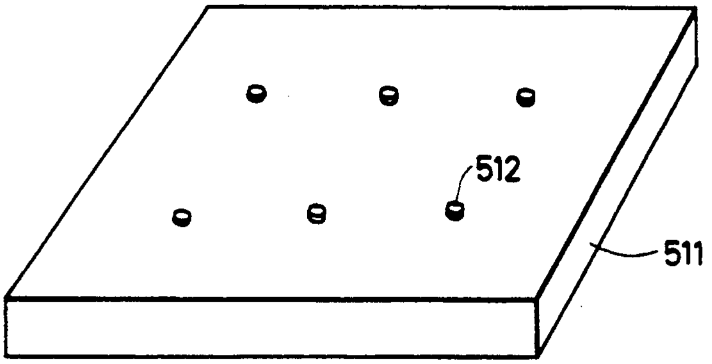
FIGS. 23A and 23B are perspective views of a substrate of FIGS. 22A and 22C, respectively.
Figure 23B:
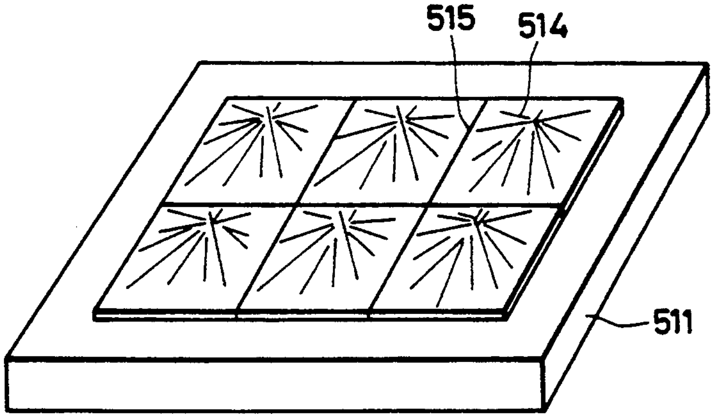

FIGS. 22A to 22C are views for explaining a method of forming a single crystal, and FIGS. 23A and 23B are perspective views of the substrate of FIGS. 22A and 22C, respectively.

As shown in FIGS. 22A and 23A, a thin film of a heterogeneous material having a higher nucleation density than that of an amorphous insulating substrate 511 is formed thereon and patterned to obtain micropatterned heterogeneous material regions 512 which are separated from each other by a distance l. The heterogeneous material regions 512 include a denatured region containing an excess amount of Si and N and formed by implanting Si and N ions in the amorphous insulating substrate 511.

Single nuclei of a thin film material are respectively formed in only the heterogeneous material regions 512 in accordance with the proper deposition conditions. Each heterogeneous material region 512 must be micropatterned enough to allow formation of only single nucleus. The pattern size of the heterogeneous material region 512 varies depending on the types of materials but falls within several microns. The nucleus is grown while maintaining the single crystal structure, and single crystal islands 513 shown in FIGS. 22B are formed. In order to form the islands 513, deposition conditions must be determined such that no nucleus formation reations occur on the amorphous insulating substrate 511.

The crystal orientation of each island 513 along a direction normal to the substrate surface is determined such that energy of an interface between the material of the substrate 511 and the thin film material is minimized because the surface or interface energy has anisotropy by the crystal surface. However, as described above, the crystal orientation within the surface of the amorphous substrate is not determined.

The single crystal islands 513 are grown centered on the corresponding heterogeneous material regions 512 while maintaining the single crystal structure. As shown in FIG. 22C, the adjacent single crystal islands 513 are brought into contact with each other. Since the crystal orientation within the substrate surface is not determined, a crystal interface 515 is formed at the intermediate position between the heterogeneous material regions 512.

The single crystal regions 513 are three-dimensionally grown and the crystal surface having a low growth rate appears as a facet, thereby forming single crystal regions 514 each with a conical portion. The size of each single crystal region 514 is determined by the distance Z between the heterogeneous material regions 512. By properly determining the formation pattern of the heterogeneous material regions 512, the interface position can be controlled. Therefore, single crystal regions having a predetermined size can be aligned in a desired manner.

Figure 24A:
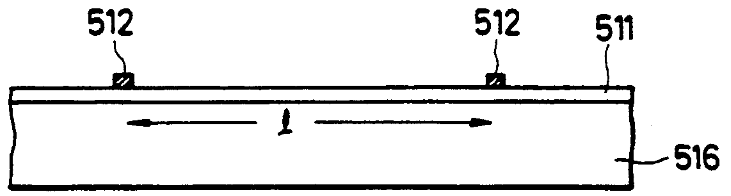
FIGS. 24A to 24C re views for explaining the steps in forming a single crystal according to another single-crystal formation method.
Figure 24B:
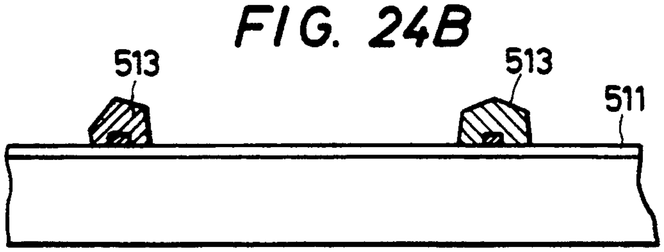
Figure 24C:
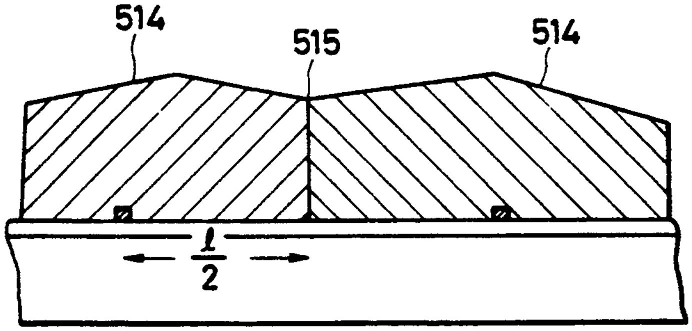

FIGS. 24A to 24C are views for explaining another method of forming a single crystal.

As shown in FIGS. 24A to 24C, a thin film 511 consisting of a material having a lower nucleation density than that of a desired substrate 516 so as to allow selective deposition is formed thereon. Heterogeneous material regions 512 are formed on the substrate 516 and are spaced apart from each other by a distance l. Single crystal layers 514 are formed in the same manner as in FIGS. 22A to 22C.

As described above in detail, according to the electron emission element of this embodiment, the conditions for forming the single crystal of the high-resistance film are determined by conditions such as the substrate or the insulating film which constitutes a deposition surface, the heterogeneous material, the material of the deposit of the single crystal, and the deposition conditions. The conical portions can be formed centered on the corresponding single nuclei grown in the heterogeneous material regions in the identical conditions. Variations in size of the conical portion can be prevented. The position of the conical portion can be determined by the position of the heterogeneous material region. Therefore, the conical portion can be formed at a desired position with high precision.

Since the single crystal region can be easily formed centered on the corresponding heterogeneous material region, wide material selection can be allowed without considering crystallinity or the like between the deposition material and the deposition surface. A single crystal can be formed on an amorphous substrate which can rarely allow formation of the single crystal thereon. A large area of the single crystal can be assured.

In addition, the single crystal region having a conical shape unique to the single crystal can be formed. The shape of the electron emission portion can be made uniform and sharp. Variations in initial operating voltage can be suppressed, and electron emission efficiency can be improved. The electron emission portion as the conical portion can be matched with the crystal surface having a predetermined structure, thereby improving the Schottky effect and electron emission efficiency.

Since the electron emission element can be manufactured in the conventional semiconductor fabrication process, a high packing density can be achieved by an easy fabrication process.

When a deriving electrode is formed on the high-resistance film, the field intensity can be increased and electron emission efficiency can be improved.

In the above embodiment, the deposition surface can be formed on an underlying substrate of a desired material. For example, the deposition surface can be formed on a substrate having high heat dissipation efficiency, and element reliability can be improved.

Figure 25:
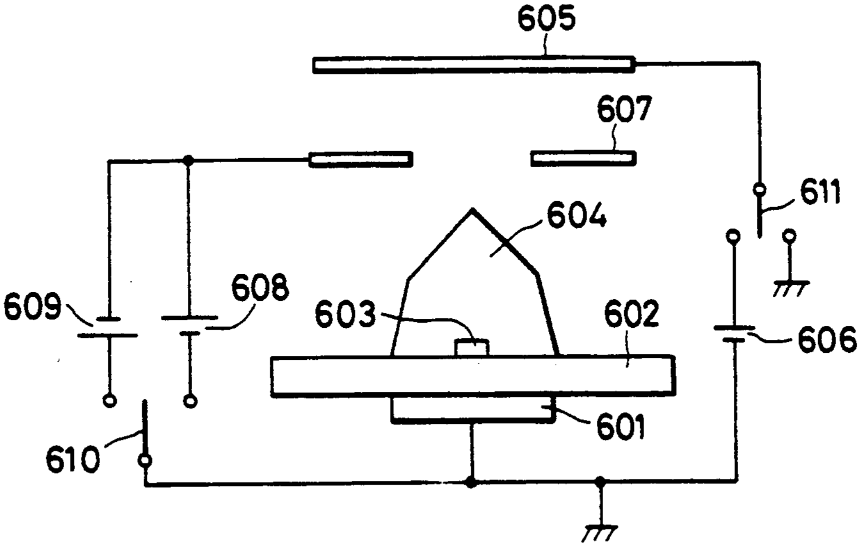
FIG. 25 is a schematic view of a first electron emission device used for a still another method according to the present invention.

FIG. 25 is a schematic view of a first electron emission device according to still another method of the present invention.

As shown in FIG. 25, a nucleus formation base 603 of Si or $Si_3N_4$ is formed on a deposition surface of an oxide substrate 602 consisting of an amorphous material such as $SiO_2$. A single crystal of Mo, W, Si, or the like is grown centered on a single nucleus formed in the nucleus formation base 603, thereby forming an electron emission electrode 604 having a desired size and a conical portion. In general, it is difficult to form a single crystal on an insulating material, but such formation can be achieved by a method to be described later.

A voltage application electrode 601 is formed on the lower surface of the oxide substrate 602 consisting of an insulating material. The voltage application electrode 601 opposes an electron emission electrode 604. A deriving electrode 607 which increases the field intensity at the conical portion and serves as a charge supply means is formed above the electron emission electrode 604. The deriving electrode 607 is formed such that an insulating layer having an opening corresponding to the electron emission region of the electron emission electrode 604 is formed on the oxide substrate 602, and a metal plate having a corresponding opening is formed on the insulating layer.

A target 605 to be irradiated with electrons emitted from the emission electrode is arranged above the deriving electrode 607. A power source 606 is connected between the target 605 and the voltage application electrode 601 such that the potential of the target 605 is higher than that of the electrode 601. The ON/OFF operation of the power source 606 is controlled by a switching means 611.

Power sources 608 and 609 are connected in parallel with each other between the deriving electrode 607 and the voltage application electrode 601. The power source 608 is operated such that the potential of the deriving electrode 607 is higher than that of the voltage application electrode 601. The power source 609 is operated such that the potential of the voltage application electrode 601 is higher than that of the deriving electrode 607. The power sources 608 and 609 are switched by a switching means 610.

The operation of the electron emission device having the above arrangement will be described below.

The power source 606 is operated by the switching means 611 to apply a voltage between the target 605 and the voltage application electrode 601. The power source 608 is operated by the switching means 610 to apply a voltage between the deriving electrode 607 and the voltage application electrode 601. Potential differences are generated between the electron emission electrode 604, the target 605, and the deriving electrode 607. Electrons are emitted from the electron emission electrode 604 (electron emission operation). In this case, the electron emission portion is mainly a conical portion of the electron emission electrode 604 which has a high field intensity. By this electron emission, positive charge is accumulated on the electron emission electrode 604, and the field intensity is weakened. The amount of electron emission is reduced, and electrons are finally no longer emitted.

The power source 609 is operated by the switching means 610 to apply a reverse voltage (discharge voltage) between the deriving electrode 607 and the voltage application electrode 601. At the same time, the voltage having applied to the target 605 is set to 0 V by the switching means 611. Electrons are emitted from the deriving electrode 607 to the electron emission electrode 604. The emitted electrons are coupled to the positive charge accumulated on the electron emission electrode 604 to cancel the positive charge. Therefore, the electron emission electrode 604 can emit electrons (discharge operation).

The above electron emission and discharge operations are repeated to emit electrons.

Figure 26:
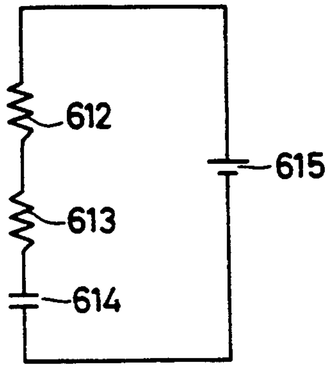
FIG. 26 is an equivalent circuit diagram of the first electron emission device of the present invention.

FIG. 26 is an equivalent circuit diagram of the device shown in FIG. 25 during the electron emission operation.

Referring to FIG. 26, a resistor 612 is equivalent to the target 605 and the electron emission electrode 604. A resistor 613 is equivalent to the electron emission electrode 604. A capacitor 614 is equivalent to the electron emission electrode 604, the oxide substrate 602, and the voltage application electrode 601. A power source 615 is equivalent to the power source 606 for applying a voltage between the voltage application electrode 601 and the target 605 and the power source 608 for applying a voltage between the voltage application electrode 601 and the deriving electrode 607.

The magnitude of the voltage applied between the target 605 and the electron emission electrode 604 with respect to the application voltage from the power source 615 during the electron emission operation will be calculated.

A resistance RA of the resistor 612 is given as follows if the emission current density is 10 A/cm$^2$, a voltage from the power source 615 is 100 V, and a cross section of the electron emission portion of the electron emission electrode 604 is given as 1 $\mu m^2$:

$$RA = 10^9\ (\Omega)$$

A resistance RS of the resistor 613 is given as follows if a resistivity $\rho$ is 10 $\Omega$.cm, the average length l of the electron emission electrode 604 is 1 $\mu$m, and the cross section S is given as 1 $\mu m^2$:

$$RS = \rho \cdot l/S = 10^4\ (\Omega)$$

If a capacitance C of the capacitor 614 is given as follows under the conditions that the thickness t of the oxide substrate 602 is 1,000 Å the electrode area S is 10 $\mu m^2$, and the specific dielectric constant $\epsilon s$ is 4:

$$C = \epsilon s \cdot \epsilon_0 \cdot S/d = 3.6 \times 10^{-18}$$

If the operating frequency is given as 1,000 MHz, an impedance (Z) by the capacitor 614 is given as follows:

$$Z = 5 \times 10^7\ (\Omega)$$

Under these conditions, a ratio of the voltage applied between the target 605 and the electron emission electrode 604 to the voltage supplied from the power source 615 is given as follows:

$$|Z|/|RA+RS+Z| < 1/10$$

The voltage applied between the target 605 and the electron emission electrode 604, that is, the voltage for allowing electron emission is not so greatly influenced by the capacitor.

In the first electron emission device as described above, electrons are supplied from the charge supply means and can be emitted from the electron emission electrode arranged independently of the insulating surface. Therefore, the dielectric breakdown voltage can be greatly increased. The wiring layer need not be formed along the surface of the insulating material or wiring by forming a though hole in the insulating layer on the conductive substrate need not be performed. Therefore, the packing density can be greatly increased.

The electron emission electrode 604 need not consist of a single crystal but can consist of a polycrystal if a conical portion can be formed. However, if the electron emission electrode 604 consists of a single crystal, the electrode can have a conical shape unique to the single crystal. The shape of the electron emission portion is made uniform and sharp. Any tapering technique need not be utilized, and a higher field intensity can be obtained with uniformity. Variations in initial operating voltage can be prevented and electron emission efficiency can be improved. In the above method, a micropatterned heterogeneous material region having a sufficiently higher nucleation density than that of the material of the deposition surface and allowing the growth of only the single nucleus is formed on the deposition surface, and the crystal is grown centered on the single nucleus grown in the heterogeneous material region. This method can also be applied to other methods when a polycrystal or the like is used.

When the method of growing the crystal centered on the single nucleus grown in the heterogeneous material region is used, the following advantages can be obtained.

(1) The shape of the electron emission electrode with a conical portion is determined by the conditions such as the deposition surface, the heterogeneous material, the material of the deposit, and the deposition conditions. The size of the conical portion can be easily controlled. Therefore, a conical portion having a desired size can be formed, and variations in its size can be prevented.

(2) Since the position of the electron emission electrode with a conical portion can be determined by the position of the heterogeneous material region, the electrode can be formed at a desired position with high precision. In addition, the plurality of electron emission ports in the multi type electron emission element can be uniformly set at fine pitches.

(3) Unlike in the conventional case, a single crystal can be formed on an amorphous insulating substrate, and an electron emission element having a high dielectric breakdown voltage can be provided.

(4) The element can be formed by the conventional semiconductor fabrication process and can be highly integrated by the easy process.

A second electron emission device using the above method will be described below.

Figure 27:
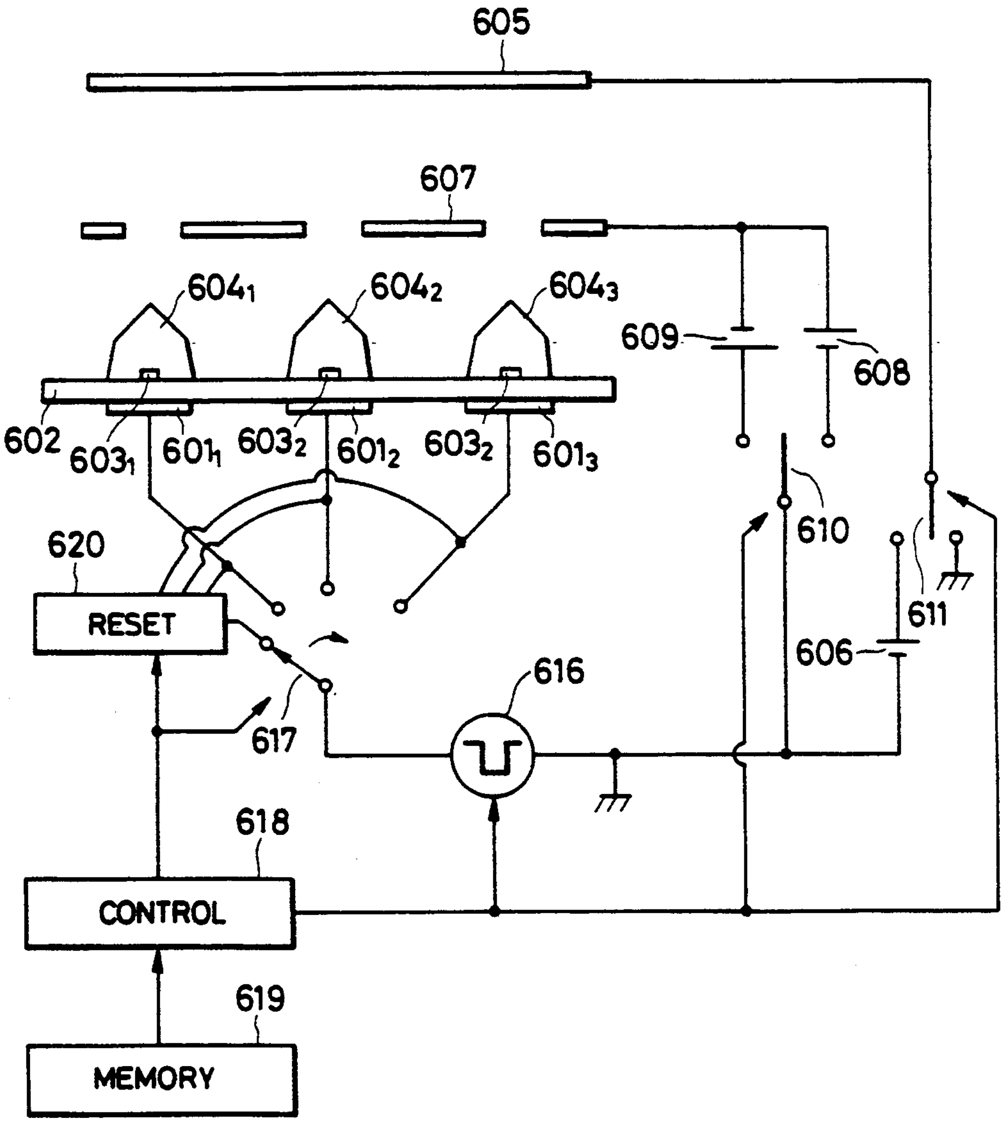
FIG. 27 is a schematic view of a second electron emission device used for the method of FIG. 25.

FIG. 27 is a schematic view of the second electron emission device. The same reference numerals as in FIG. 25 denote the same parts in FIG. 27.

As shown in FIG. 27, nucleus formation bases 603$_1$ to 603$_3$ of Si, $Si_3N_4$ or the like are formed on a deposition surface of an oxide substrate 602 consisting of an amorphous material such as $SiO_2$. Single crystal regions of Mo, W, Si, or the like are grown centered on single nuclei formed in the nucleus formation bases 603$_1$ to 603$_3$. Electron emission electrodes 604$_1$ to 604$_3$ each having a desired size and a conical portion are formed (the number of electron emission electrodes is not limited to three).

Voltage application electrodes 601$_1$ to 601$_3$ are formed on the lower surface of the oxide substrate 602 consisting of an insulating material so as to oppose electron emission electrode 604$_1$ to 604$_3$. A deriving electrode 607 which increases the field intensity of the conical portions and serves as the charge supply means is formed above the electron emission electrodes $604_1$ to $604_3$. A target 605 to be irradiated with electrons emitted from the electron emission electrodes $604_1$ to $604_3$ is arranged above the deriving electrode 607. A power source 606 is arranged between the voltage application electrodes $601_1$ to $601_3$ through a switching means 611, a pulse generator 616, and a selective switching device 617 such that the potential of the target 605 is higher than that of the voltage application electrodes. A voltage applied to the target 605 is controlled by the switching means 611.

Power sources 608 and 609 are connected in parallel to each other between the deriving electrode 607 and the voltage application electrodes $601_1$ to $601_3$ through a switching means 610, a pulse generator 616, and a selective switching device 617. The power source 609 is operated such that the potential of the voltage application electrodes $601_1$ to $601_3$ is lower than that of the deriving electrode 607. The power source 609 is operated such that the potential of the voltage application electrodes $601_1$ to $601_3$ is higher than that of the deriving electrode 607. The power sources 608 and 609 are switched by the switching means 610.

During the electron emission operation, the selective switching device 617 sequentially switches the pulses generated by the pulse generator and applies the pulses sequentially to the voltage application electrodes $601_1$ to $601_3$. During the discharge operation, a discharge voltage is applied from a reset unit 620 to the voltage application electrodes $601_1$ to $601_3$ commonly connected thereto.

The reset unit 620 commonly connects the voltage application electrodes $601_1$ to $601_3$ during the discharge operation. During the electron emission operation, the reset unit 620 applies a prebias voltage to the OFF voltage application electrodes, thereby preventing crosstalk between the adjacent electrodes.

A controller 618 supplies control signals to the reset unit 620, the selective switching device 617, the pulse generator 616, the switching means 611, and the switching means 610 and controls switching timings and pulse generation timings. The control signals output from the controller 618 are controlled by control information stored in a memory 619.

The operation of the second electron emission device having the above arrangement will be described below.

Figure 28:
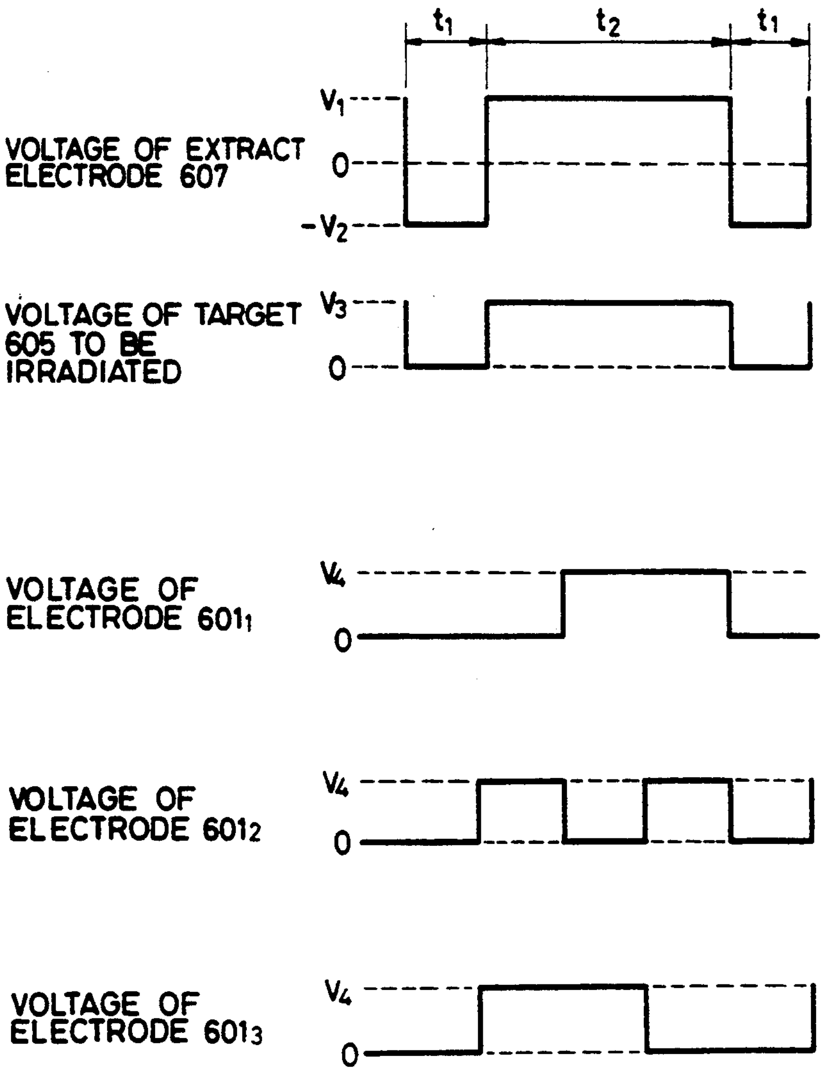
FIG. 28 is a timing chart for explaining the second electron emission device of the present invention.

FIG. 28 is a timing chart for explaining the operation of the second electron discharge device.

Referring to FIG. 28, an interval t2 is an electron emission operation interval. During this interval, the power source 606 is operated by the switching means 611 to apply a voltage V3 to the target 605. The voltage application electrodes $601_1$ to $601_3$ are sequentially set at 0 V by the selective switching device 617. As described above, the reset unit 620 applies a prebias voltage V4 to an OFF voltage application electrodes. The power source 608 is operated by the switching means 610 to apply a voltage V1 to the deriving electrode 607.

Assume that a selected electrode, i.e., the ON electrode is the voltage application electrode $601_1$. The voltage V3 is applied between the voltage application electrode $601_1$ and the target 605, and the voltage V1 is applied between the deriving electrode 607 and the electrode $601_1$. An electric field which is sufficiently high to perform electron emission is applied between the electron emission electrode $604_1$ and the target 605. Electrons are then emitted from the electron emission electrode $604_1$.

In this case, the prebias voltage V4 is applied to the nonselected or OFF voltage application electrodes $601_2$ and $601_3$. A sufficiently high electric field enough to perform electron emission is not applied between the electron emission electrode $604_1$ and the target 605, no electron emission is performed.

In this manner, the voltages are sequentially applied to the voltage application electrodes $601_2$ and $601_3$, and electrons are sequentially emitted from the electron emission electrodes $604_2$ and $604_3$. If there are three or more voltage application electrodes i.e., the voltage application electrodes 601*n* where $n>3$, the voltage pulses having the same waveform can be sequentially applied to the subsequent voltage application electrodes after the electrode $601_3$ during the interval t2.

As described above, when positive charges are accumulated on the electron emission electrodes $604_1$ to $604_3$ by electron emission. During the corresponding electron emission operation intervals, the field intensities are weakened and the amounts of electron emission are decreased. As a result, the electrons are no longer emitted.

An interval t1 is a discharge operation interval. The voltage application electrodes $601_1$ to $601_3$ are commonly connected and set at 0 V by the reset unit 620. The power source 609 is operated by the selective switching device 617 and the switching means 610 to apply a voltage $-V2$ to the deriving electrode 607. The target 605 is set at 0 V by the switching means 611. In this case, a high voltage V2 is applied between the deriving electrode 607 and the voltage application electrodes $601_1$ to $601_3$ such that the potential of the electrodes $601_1$ to $601_3$ is higher than the electrode 607. A sufficiently high electric field for electron emission is applied between the electron emission electrodes $604_1$ to $604_3$ and the deriving electrode 607. Electrons are emitted from the deriving electrode 607. The emitted electrons are coupled to the positive charges accumulated on the electron emission electrodes $604_1$ to $604_3$ to cancel the positive charges. Therefore, the electron emission electrodes $604_1$ to $604_3$ can emit the electrons.

Thereafter, electron emission is performed in the next electron emission operation interval. In this manner, the electron emission operation and the discharge operation are alternately repeated to emit electrons.

In the second electron emission device as described above in detail, the electrons are supplied from the charge supply means to allow emission of electrons from the electron emission electrodes independently formed on the insulating surface. Therefore, the dielectric breakdown voltage can be greatly increased. Electrical insulation between the adjacent electrodes can be greatly improved. Therefore, this embodiment is suitable for an electron emission device having a plurality of electron emission sources uniformly formed at fine pitches. In addition, a wiring layer need not be formed along the insulating material surface, or a through hole need not be formed in an insulating layer formed on a conductive substrate, thereby greatly increasing the packing density of the device.

In the above embodiment, the voltage pulses are time-divisionally applied to the plurality of voltage application electrodes to apply voltage components between the voltage application electrodes and the target, thereby performing electron emission operations. In this case, the circuit arrangement having a larger number of electron emission electrodes can be simplified. For example, a voltage is applied to the switching means 611 in synchronism with selection timings of the voltage application electrodes $601_1$ to $601_3$ in FIG. 27, electrons can be emitted from the desired electron emission electrode. Selection signals need not be supplied to the voltage application electrodes.

As shown in the first and second electron emission devices, if the deriving electrode is formed to increase the field intensity of the electron emission electrode and also serves as the charge supply means, a separate charge supply means need not be arranged, thereby simplifying the circuit arrangement.

A third electron emission device used in a method of the present invention will be described below.

Figure 29:
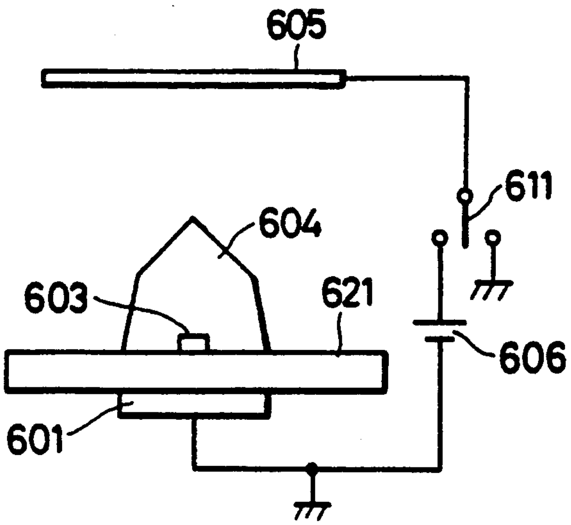
FIG. 29 is a schematic view of a third electron emission device used for the method of FIG. 25.

FIG. 29 is a schematic view of the third electron emission device. The same reference numerals as in the first electron emission device of FIG. 25 denote the same parts in the third electron emission device, and a detailed description thereof will be omitted.

The arrangement of the third electron emission device is substantially the same as that of the first electron emission device. The deriving electrode as a charge supply means, the power sources 608 and 609, and the switching means 610 are omitted (however, if the deriving electrode 607 is arranged so as to receive a positive voltage, electron emission efficiency can be improved). A substrate 621 is not a perfect insulating substrate but a semiconductive substrate which allows a leakage current. When electrons are emitted in the electron emission operation, the lost charge component is supplied from a voltage application electrode 601 to the opposite electron emission electrode through the substrate 621 consisting of a semiconductive material.

A semiconductive material may be a metal such as Pd and a semiconductor material such as $In_2O_3$, ZnO, or $SnO_2$. The substrate 621 can consist of only a semiconductive material. However, it is preferable to form a thin substrate in favor of a high-speed charge supply operation. A conductive film is generally formed on an insulating substrate. When the above materials are formed into films, their sheet resistances are given as follows: about $10^2$ to $10^7$ Ω/□ for Pd; about $10^2$ to $10^8$ Ω/§ for $In_2O_3$; about $10^2$ to $10^8$ Ω/§ for ZnO; and about $10^2$ to $10^8$ Ω/§ for $ZnO_2$.

The manufacturing conditions for forming $SnO_2$ on a glass substrate by reactive sputtering are given below:

(1) Sputtering Apparatus SPF-312H (Nichiden Anelba K.K.)

(2) Manufacturing Conditions Target: $SnO_2$ (99.9%) (Furuuchi Kagaku K.K.) Sputtering Gas: $O_2$ (100%) RF Power: 400 W Sputtering Pressure: $5\times10^{-3}$ Torr Substrate Temperature: 200° C. Deposition Time: 20 minutes (3) Annealing Condition 300° C., 1 hour ($N_2$ atmosphere)

An $SiO_2$ film having a thickness of about 500 to 1,000 Å can be formed on a glass substrate under the above conditions.

Figure 30:
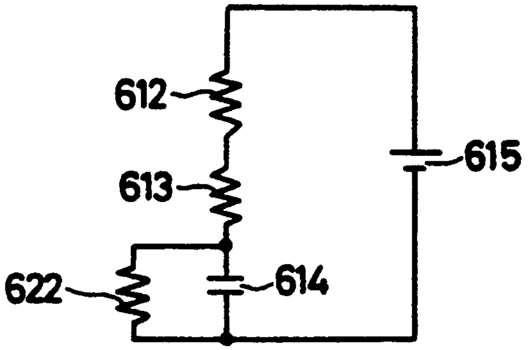
FIG. 30 is an equivalent circuit diagram of the third electron emission device in electron emission operation.

FIG. 30 is an equivalent circuit diagram of the above electron emission device during electron emission operation. The same reference numerals as in FIG. 26 denote the same parts in FIG. 30, and a detailed description thereof will be omitted.

Referring to FIG. 30, an equivalent source 607 applies a voltage between the voltage application electrode 601 and the target 605 since the deriving electrode 607, the power sources 608 and 609, and the switching means 610 are omitted. An equivalent resistor 622 represents the semiconductive material subjected to current leakage and is connected in parallel with a capacitor 614.

Figure 31:
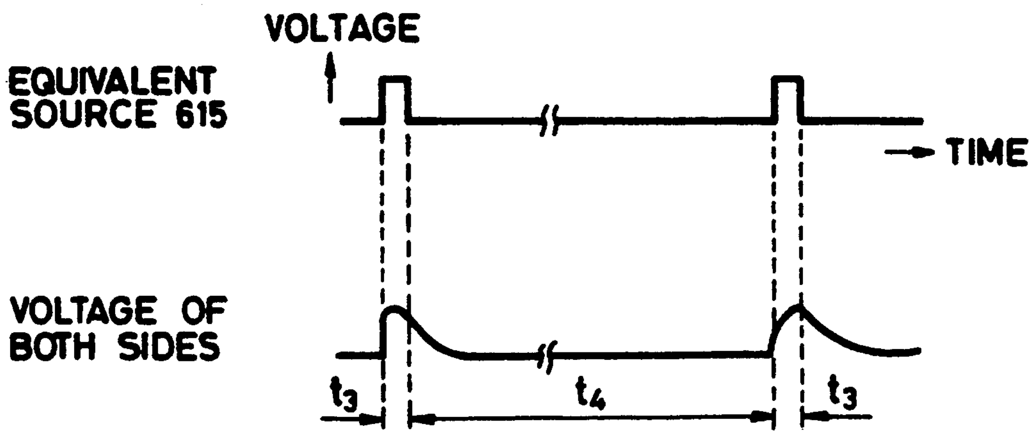
FIG. 31 is a timing chart for explaining the operation of the third electron emission device of the present invention.

FIG. 31 is a timing chart for explaining the operation of the third electron emission device described above.

As shown in FIG. 31, when a pulsed voltage from the equivalent source 615 is applied between the voltage application electrode 601 and the target 605 during an interval t3, the potential of the electron emission electrode 604 is increased. When the electrons are emitted from the electrode 604, its potential is further increased. This potential is increased until a potential difference between the target 605 and the electron emission electrode 604 is zero. Therefore, the potential is kept at a predetermined value. In this case, the voltage of both sides of the capacitor 614 is increased by a time constant defined by the resistance of the resistors 612, 613, and 622 and the capacitance of the capacitor 612.

When the potential difference between the target 605 and the electron emission electrode 604 is reduced and electron emission is completed, the equivalent source 615 is kept OFF during an interval t4. In this case, the OFF target 605 is electrically disconnected from the electron emission electrode 604, and a current is not supplied therebetween. That is, the resistance of the equivalent resistor 612 is substantially infinite. As described above, since the substrate 621 consists of a semiconductive material, the charge in the capacitor is discharged through the equivalent resistor 622.

The intervals t3 and t4 are properly set so as to correspond to the time required for charging and discharging, electron emission can be continuously performed.

A fourth electron emission device used for the method of the present invention is substantially the same as the second electron emission device of FIG. 27, except that the deriving electrode 607 as a charge supply means, the power sources 608 and 609, and the switching means 610 are omitted (however, if the deriving electrode 607 is formed so as to receive the positive voltage, electron emission efficiency can be improved), and that the substrates consists of a semiconductive material, and a detailed description thereof will be omitted.

During the electron emission operation, when a voltage having the same waveform as in the timing chart of FIG. 28 is applied to the target 605 and the voltage application electrodes $601_1$ to $601_3$, electron emission can be continuously performed. The discharge operation of this device is the same as that of the third electron emission device, and a detailed description thereof will be omitted. In this case, during an interval t3, a sufficient period of time is required to discharge the charges from the respective electrodes.

A method of forming a single crystal on a deposition surface will be described below.

Selective deposition for selectively depositing a film on the deposition surface will be described below. Selective deposition is a method of selectively forming a thin film on a substrate by utilizing differences of factors of the materials. These factors are surface energy, deposition coefficients, elimination coefficients, and surface diffusion rates and determine formation of the nucleus during the thin film formation process.

According to the above electron emission method, the lost charge from the electron emission electrode during the electron emission operation is replenished after the electron emission operation. The electron emission electrode can thus be formed on the insulating layer, and dielectric breakdown voltage of the device can be increased. A wiring layer need not be formed along the surface of the insulating layer, or a through hole need not be formed in an insulating layer on a conductive substrate. Therefore, the packing density of the device can be greatly increased.

In the first electron emission device, the electrons are supplied from the charge supply means after the electron emission operation, and the isolated electron emission electrode formed on the insulating surface can continuously emit the electrons. Therefore, the dielectric breakdown voltage can be greatly increased. The amount of charge to be supplied to the electron emission electrode can be arbitrarily set, and the time required for discharge can also be arbitrarily set.

In the second electron emission device, the electrons are supplied from the charge supply means after the electron emission operation and the electrons can be continuously emitted from the plurality of isolated electron emission electrodes on the insulating surface. The dielectric breakdown voltage can be greatly increased. Electrical insulation between the adjacent electrodes can be improved. This device is suitable for an electron emission device having a plurality of electron emission sources uniformly formed at fine pitches. In addition, the amount of charge supplied to the electron emission electrodes can be arbitrarily set, and the time required for discharge can also be arbitrarily set.

Furthermore, the voltage is time-divisionally applied to the plurality of voltage application electrodes to apply voltage between the voltage application voltages and the target, thereby performing electron emission. In this case, a circuit arrangement having a larger number of electron emission electrodes can be simplified, the number of constituting components can be reduced, and the packing density can be increased.

In the first and second electron emission devices, if the deriving electrode is arranged to increase a field intensity of the electron emission electrode and is used as the charge supply means, a separate charge supply means need not be formed, thereby simplifying the circuit arrangement.

In the third electron emission device, the electron emission electrode is formed on a semiconductive material, the charge lost during the electron emission operation of the electron emission electrode can be supplied through the semiconductive material. The dielectric breakdown voltage can be increased. In addition, a special charge supply means need not be formed, and the device arrangement can be simplified.

In the fourth electron emission device, the plurality of electron emission electrodes are formed on a semiconductive material. The charge lost during the charge emission operation of the plurality of electron emission electrodes can be supplied through the semiconductive material. The dielectric breakdown voltage can be increased. Electrical insulation between the adjacent electrodes can be improved. This device can be suitably applied to an electron emission device having a plurality of electron emission sources uniformly formed at fine pitches. A special charge supply means need not be arranged, and the device arrangement can be simplified.

FIGS. 32A to 32F are schematic partial sectional views for explaining the steps in manufacturing an electron emission element according to still another method of the present invention.

Figure 32A:
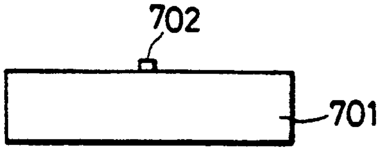
FIGS. 32A to 32F are schematic partial view sectional views for explaining the steps in manufacturing an electron emission element according to still another method of the present invention.

As shown in FIG. 32A, a nucleus formation base 702 of a heterogeneous material such as Si or $Si_3N_4$ is formed on a deposition surface of a substrate 701 consisting of an amorphous insulating material such as $SiO_2$.

Figure 32B:
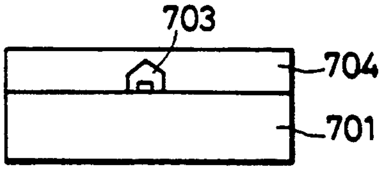

As shown in FIG. 32B, a single crystal of Mo, W, Si, or the like is grown centered on a single nucleus formed in the nucleus formation base 702. An electrode 703 having a desired size and a conical portion is formed. In the following description, the crystal formed on the deposition surface is a single crystal. However, the crystal formed on the deposition surface is not limited to the single crystal but can be extended to a polycrystal. A method of forming the single crystal will be described in detail later. An insulating material such as a polyimide resin film or an acrylate film is deposited on the electrode 703 with the conical portion and the substrate 701.

Figure 32C:
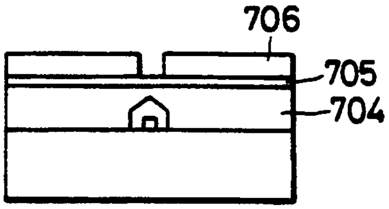

As shown in FIG. 32C, an electrode layer 705 such as an Mo layer is formed on the insulating layer 704. A photoresist 706 is applied to the electrode layer 705 and exposed to form an opening immediately above the conical portion of the electrode 703.

Figure 32D:
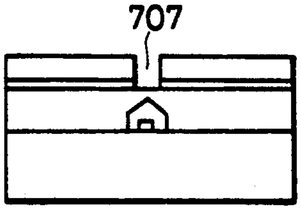

As shown in FIG. 32D, the electrode layer 705 is etched to form an opening 707.

Figure 32E:
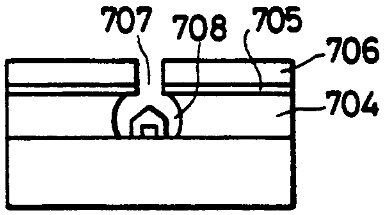

As shown in FIG. 32E, the insulating layer 704 is selectively etched through the opening 707 to form an opening 708, so that at least the conical portion of the electrode 703 is exposed.

Figure 32F:
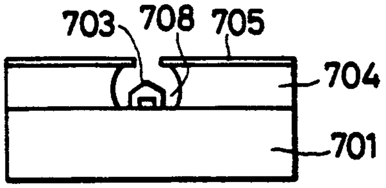

Finally, as shown in FIG. 32F, the photoresist 706 is removed to prepare an electron emission element.

In the above method, the electrode 703 with a conical portion is formed on the $SiO_2$ substrate 701. However, an amorphous $SiO_2$ film 701*a* may be formed on an underlying substrate to prepare an electron emission element in the same manner as described above.

Figure 33:
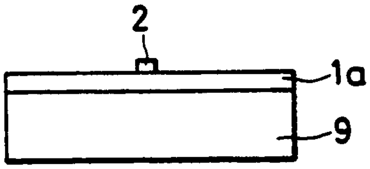
FIG. 33 is a schematic partial sectional view for explaining the step in manufacturing an electron emission element according to the method of FIGS. 32A to 32F.

FIG. 33 is a schematic partial sectional view showing a step of forming another electron emission element using the method of FIGS. 32A to 32F.

Referring to FIG. 33, an amorphous film 701*a* is formed on an Si underlying substrate 709. A nucleus formation base 702 is formed on the amorphous film 701*a*, thereby forming the electron emission element on the Si underlying substrate. The subsequent steps are the same as those in FIGS. 32B to 32F, and a detailed description thereof will be omitted.

As described with reference to the method of manufacturing the electron emission devices in FIGS. 32A to 33, an electrode with a conical portion serving as an electron emission portion is centered on a single nucleus formed in a micropatterned heterogeneous material region and is formed on a clean surface. An insulating layer and a deriving electrode thereon are sequentially formed to obtain the electrode with the conical portion of a single crystal substantially free from crystal defects. The shapes of the conical portions as the electron emission portions can be made uniform to result in an increase in field intensity. Variations in initial operating voltage can be minimized.

As shown in FIG. 33, the deposition surface can be formed on the underlying substate of a desired material. For example, the deposition surface may be formed on a substrate having high heat dissipation efficiency, thereby improving device reliability.

A sufficiently micropatterned heterogeneous material region which has a sufficiently higher nucleation density than that of the material of the deposition surface and allows growth of only the single nucleus is formed on the deposition surface. The crystal is grown centered on the single nucleus grown in the heterogeneous material region. According to this method, the electrode 703 with the conical portion is determined by conditions such as the insulating layer 704 constituting the deposition surface, the nucleus formation base 702, the material of deposit, and the deposition conditions. The size of the electrode 703 is determined independently of the size of the opening 707. Variations in sizes of the electrodes 703 can be prevented. The position of the electrode 703 can be determined by the position of the nucleus formation base 702. The electrode 703 can be formed at a desired position with high precision. As a result, the plurality of electron emission ports of the multi type electron emission element can be formed at fine pitches with uniformity.

The electrode with the conical portion can be easily formed by the single crystal. The conductivity of the electrode with the conical portion can be improved, and the electron emission portion as the conical portion can be matched with the crystal surface having a predetermined structure, thereby improving the Schottky effect and electron emission efficiency.

A method of growing the single crystal on the deposition surface will be described below.

Selective deposition for selectively forming a film on a deposition surface will be described below. Selective deposition is a method of selectively forming a thin film on a substate by utilizing differences of factors of the materials. The factors are surface energy, deposition coefficients, elimination coefficients, surface diffusion rates, and the like and determine the formation of the nucleus in the thin film formation process.

According to the method described in detail above, an electrode with a conical portion serving as an electron emission portion is centered on a single nucleus formed in a micropatterned heterogeneous material and is formed on a clean surface. An insulating layer and a deriving electrode thereon are sequentially formed to obtain the electrode with the conical portion of a single crystal substantially free from crystal defects. The shapes of the conical portions as the electron emission portions can be made uniform to result in an increase in field intensity. Variations in initial operating voltage can be minimized.

Furthermore, the deposition surface can be formed on the underlying layer of a desired material. For example, the deposition layer can be formed on a substrate having high heat dissipation efficiency, and device reliability can be greatly improved.

Figure 34:
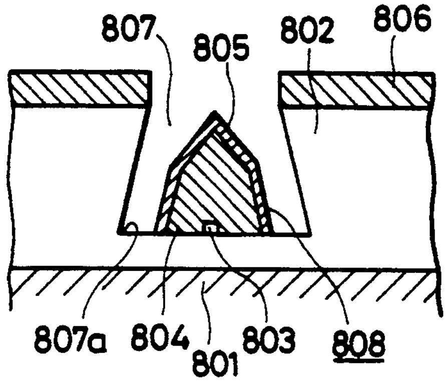
FIG. 34 is a schematic partial sectional view for explaining an electron emission element according to the present invention.

FIG. 34 is a schematic partial sectional view showing an element emission element according to still another method of the present invention.

Referring to FIG. 34, an insulating layer 802 of an amorphous insulating material such as $SiO_2$ is formed on a substrate 801 of Si or the like. The insulating layer 802 is photoetched to form a recess 807. In this embodiment, a bottom surface 807*a* of the recess 807 serves as the deposition surface, and the side wall surface consisting of the insulating member, and these are formed in a single process. However, the insulating member may be formed on the deposition surface in a separate step. The material of the insulating member may be the same as that of the deposition surface or may consist of a material different therefrom.

A nucleus formation base 803 consisting of a heterogeneous material such as Si or $Si_3N_4$ is formed on the bottom surface 807*a* (deposition surface) of the recess 807. A single crystal such as an Si single crystal is grown, centered on the single nucleus formed in the nucleus formation base 803. A conductive member 804 with a conical portion is formed, and a heat-resistive conductive film 805 is formed on the conductive member 804, thereby preparing an electrode 808 with a conical portion. The material of the conductive member 804 is not limited to a specific one if a predetermined current can flow therethrough. The conductive material may be thus a semiconductor or a conductor. A method of forming the single crystal of the conductive member will be described later.

The heat-resistive conductive film 805 consists of W, $LAB_6$, or the like and is formed on the conductive member 804 in accordance with a desired manufacturing method. For example, in order to form a film on a conductive member of an Si single crystal, CVD is performed to cause the following chemical reaction on the Si single crystal:

$$Si+WF_6 \rightarrow W+SiF_4$$

so that a W film is formed on the Si single crystal film.

A deriving electrode 806 is formed near the conical portion of the electrode 808 above the insulating layer 802. The deriving electrode 806 can be formed as follows. The recess 807 is filled with a resist, and a metal layer such as an Mo layer is formed on the resist layer and the insulating layer 802. The metal layer is photoetched to form an opening near the conical portion of the electrode 808. Finally, the resist film is removed.

In the above embodiment, the deposition surface material is not limited to the insulating material. A semiconductor material or a conductor material may be used. However, if an insulating material is used, the dielectric breakdown voltage can be increased. In the above embodiment, the insulating layer 802 is formed on the substrate 801 to constitute the deposition surface. However, the surface of an insulating substrate may serve as the deposition surface.

Figure 35:
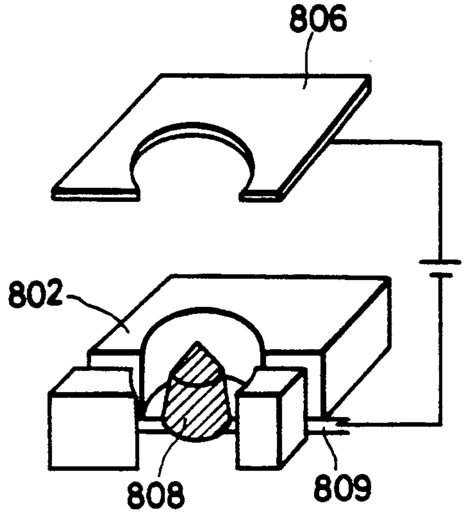
FIG. 35 is a schematic perspective view for explaining wiring of the electron emission element described above.

FIG. 35 is a schematic perspective view for explaining wiring of the electron emission element of this embodiment.

Referring to FIG. 35, wiring of the above electron emission element can be performed as follows. After the electrode 808 having a conical portion is formed on the bottom surface 807*a* of the recess 807, a groove is formed in the insulating layer 802. A wiring layer 809 is formed in the groove and is connected to the electrode 808 with the conical portion. A voltage is applied between the wiring layer 809 and the deriving electrode 806 such that the potential of the deriving electrode 806 is higher than that of the wiring layer 809, and electron emission can be performed. In the above arrangement, the deriving electrode 806 is formed such that the metal layer such as an Mo layer is etched in the process. However, a metal plate with an opening can be adhered to the insulating layer 802 after the groove is formed.

In the above electron emission element, the electrode with the conical portion comprises the conductive member with the conical portion and the heat-resistive conductive film formed thereon. The electron emission portion can be constituted by the conductive film having high heat resistance to prevent deformation of the conical portion caused by melting with heat. In addition, most of the electrode with the conical portion is made of the conductive member having high conductivity, thereby preventing unnecessary heat generation.

Figure 1:
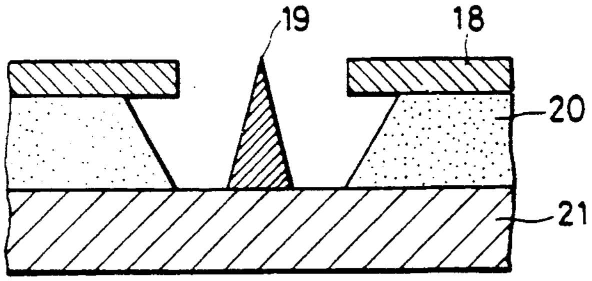
FIG. 1 PRIOR ART
FIG. 1 is a schematic partial sectional view showing part of a conventional field effect electron emission element.
Figure 2A:
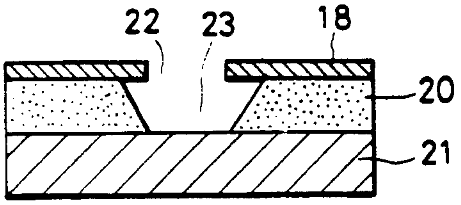
FIG. 2A PRIOR ART
FIGS. 2A to 2D are schematic partial sectional views for explaining the steps in manufacturing the element shown in FIG. 1.
Figure 2B:
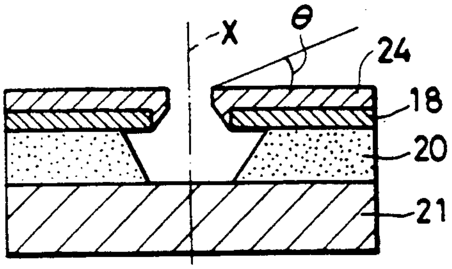
FIG. 2B PRIOR ART
Figure 2C:
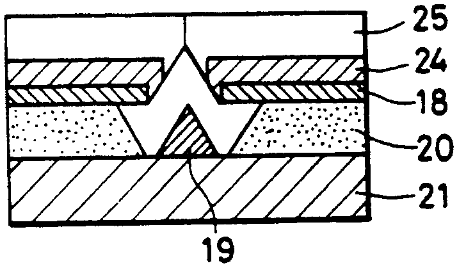
FIG. 2C PRIOR ART
Figure 2D:
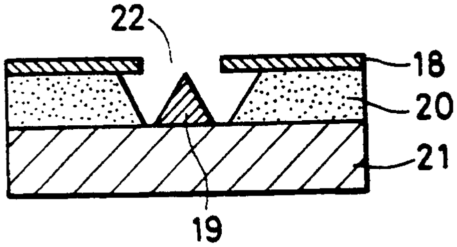
FIG. 2D PRIOR ART
Figure 3:
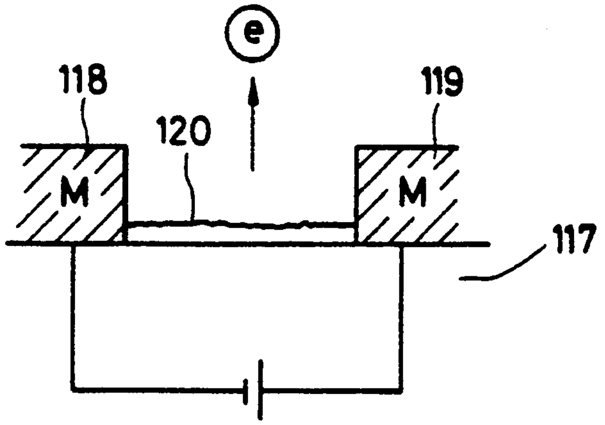
FIG. 3 PRIOR ART
FIG. 3 is a schematic view for explaining a surface conduction type electron emission element.

The conductive member preferably consists of a single crystal in favor of its conductivity. However, the material of the conductive member is not limited to the single crystal but can be a polycrystal or the like. The method of forming the conductive member is not limited to the method of growing the single crystal described above. Although the method shown in FIG. 1 may be utilized, the single crystal growing method of forming a micropatterned heterogeneous material having a sufficiently higher nucleation density than that of the deposition surface so as to allow formation of only the single nucleus, and growing the crystal by using the single nucleus as its center has the following advantages.

(1) The shape of the electrode with the conical portion is determined by the deposition surface, the heterogeneous material, the material of the conductive member, and the deposition conditions. The electrode with the conical portion can be formed independently of the sizes of the openings of the insulating member and the deriving electrode. Therefore, an electrode with a conical portion having a desired size can be formed, and variations in its size can be prevented.

(2) Since the position of the electrode with the conical portion can be determined by the position of the heterogeneous material region. The electrode with the conical portion can be formed at a desired position with high precision. A multi type electron emission element can be formed such that its plurality of electron emission ports can be uniformly determined at fine pitches.

(3) Since the electrode with the conical portion has a conical shape unique to the single crystal and the shapes of electron emission portions are made uniform and sharp. Therefore, an additional tapering technique need not be used, and the field intensity can be uniform and high. Variations in initial operating voltage can be prevented, and electron emission efficiency can be improved.

(4) Unlike the conventional case, the single crystal can be easily formed on the amorphous insulating substate, thereby providing an electron emission element having a high dielectric breakdown voltage.

(5) Since the electron emission element can be formed by the conventional semiconductor fabrication process, a high packing density can be achieved by the easy process.

A method of growing the single crystal on the deposition surface will be described below.

Selective deposition for selectively forming a film on a deposition surface will be described below. Selective deposition is a method of selectively forming a thin film on a substate by utilizing differences of factors of the materials. The factors are surface energy, deposition coefficients, elimination coefficients, surface diffusion rates, and the like and determine the formation of the nucleus in the thin film formation process.

Figure 36A:
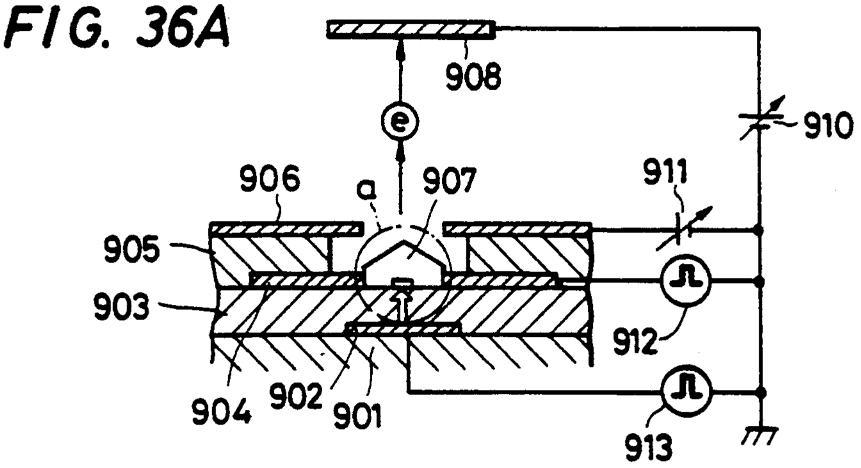
FIG. 36A is a schematic view showing an electron emission element according to the present invention.
Figure 36B:
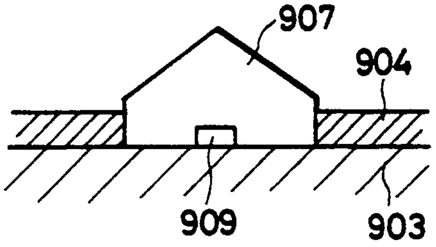
FIG. 36B is a partial enlarged view of the a portion in FIG. 36A.

FIG. 36A is a schematic view showing an electron emission device using still another method of the present invention, and FIG. 36B is an enlarged view of the a portion in FIG. 36A.

Figure 37:
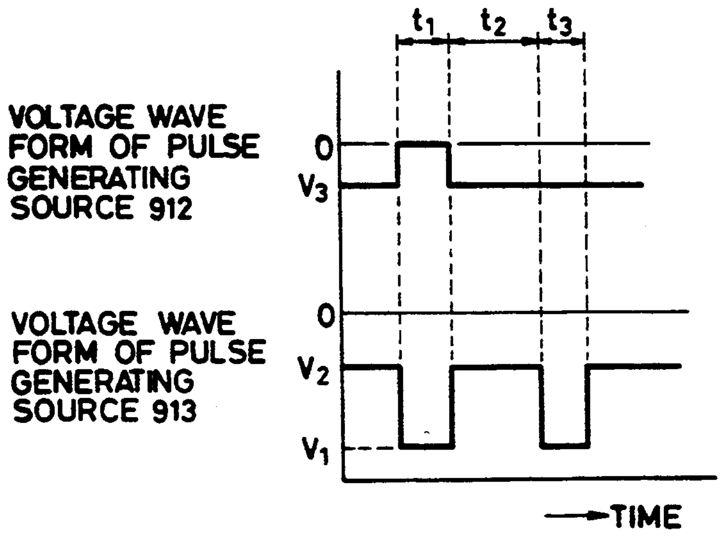
FIG. 37 is a timing chart for explaining the operation of this electron emission element.

FIG. 37 is a timing chart for explaining the operation of the electron emission device shown in FIGS. 36A and 36B.

As shown in FIG. 36A, a voltage application electrode 902 of a metal (e.g., Al, Ta, Mo, or W) or a semiconductor (e.g., Si) is formed on a substrate 901. An insulating layer 903 consisting of an insulator such as $Al_2O_3$, $Ta_2O_5$, or $SiO_2$ and having a thickness of 50 to 150 Å is formed on the voltage application electrode 902. As shown in FIG. 36B, nucleus formation base 909 consisting of a material different from that of the insulating layer 903 is formed on the insulating layer 903 at position opposite to the electrode 902. A single crystal such as an Si single crystal is centered on the single nucleus formed in the nuclear formation base 909 to obtain an electron emission electrode 907 having a size of about 50 to 10,000 Å and a substantially conical portion.

A metal layer 904 consisting of Al, Au or Pt is formed on the insulating layer 903 and is connected to the electron emission electrode 907. The material of the electrode 907 is not limited to the single crystal but may be replaced with a polycrystal. However, if the single crystal is used, the conductivity and electron emission efficiency of the electrode 907 can be improved. In general, it is difficult to form a single crystal on the surface of the insulating material. However, according to the method of forming the single crystal as described above, the single crystal can be easily formed on the insulating layer.

Note that a method of forming the electron emission electrode 907 will be described later.

An insulating layer 905 consisting of $SiO_2$, $Si_3N_4$, or polyimide resin and having an opening centered on the electrode 907 is formed on the metal layer 904. A deriving electrode 906 having an electron emission port is formed on the insulating layer 905.

When a predetermined voltage is applied between the electrode 902 and the metal layer 904, the electrode 902 can be rendered conductive with the electrode 907 by a tunneling effect. In this case, a voltage is applied from a power source 911 to the deriving electrode 906 such that the potential of the electrode 906 is high. A voltage is applied from a power source 910 to a target 908 such that the potential of the target 908 is high. Electrons are emitted from the conical portion of the electrode 907.

In the electron emission device having the above arrangement, the voltage applied to the electrode 902 and the voltage applied to the metal layer 904 are controlled to emit the electrons at a desired timing.

As shown in FIG. 36A, a pulse generator 913 is connected to the electrode 902, and a pulse generator 912 is connected to the metal layer 904. As shown in FIG. 37, a negative voltage V1 is applied to the electrode 902 and a voltage of 0 V is applied to the metal layer 904 during an interval t1. In this case, the potential difference ($V1-0$) is set to be a value exceeding a predetermined value, the electrons pass through the insulating layer 903 by the tunneling effect and are emitted from the conical portion of the electron emission electrode 907. A negative voltage V2 ($>V1$) is applied to the electrode 902 and a negative voltage V3 is applied to the metal layer 904 during an interval t2. If a potential difference ($V3-V2$) is set to be a value below a predetermined value, electron tunneling is prevented, and the electrodes 902 and 907 are rendered nonconductive. When the negative voltage V1 is applied to the metal layer 904 and the potential difference ($V3-V1$) is set to be a value smaller than a predetermined value, tunneling is prevented. The electrical disconnection between the electrodes 902 and 907 is maintained.

Electron emission control by the pulsed voltages described above can be suitably applied to a matrix type multi electron emission device having a plurality of electron emission sources.

Figure 38:
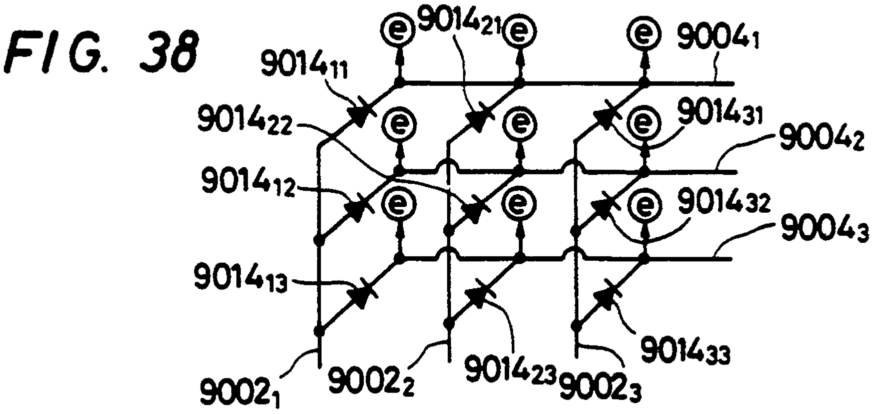
FIG. 38 is an equivalent circuit diagram of an element emission portion in a multi type electron emission element according to the present invention.

FIG. 38 is an equivalent circuit diagram of an electron emission portion in the multi type electron emission device according to the present invention.

Figure 39A:
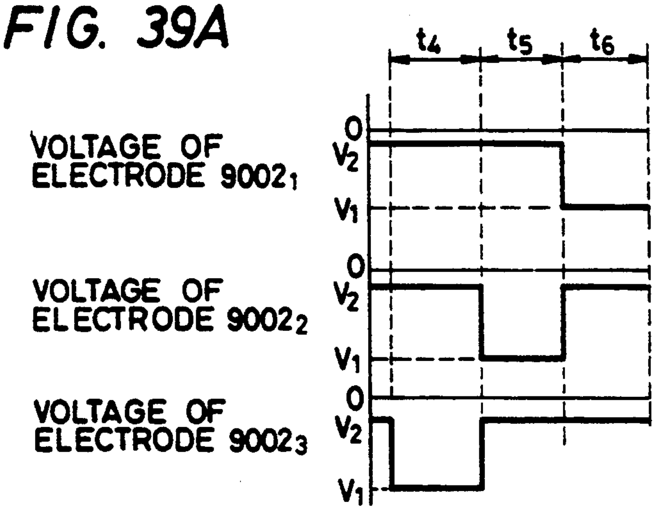
FIGS. 39A and 39B are timing charts showing voltages applied to electrodes arranged in a matrix form.
Figure 39B:
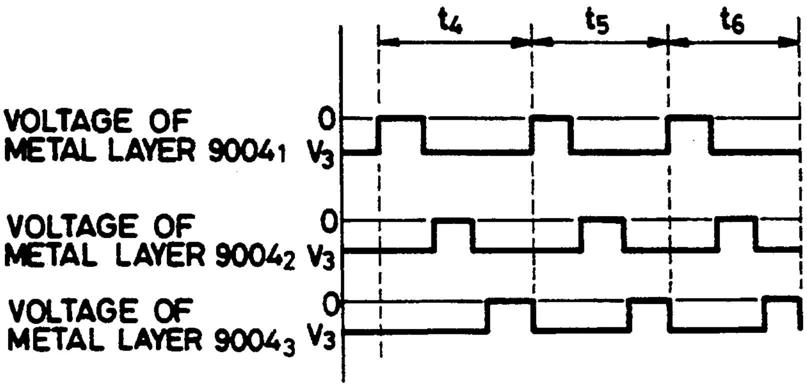

FIGS. 39A and 39B are timing charts for explaining timings of voltages applied to the electrodes arranged in the matrix form.

Referring to FIG. 38, diodes $914_1$ to $914_{33}$ have an MIN structure comprising electrodes 902, the insulating layer 903 and the electron emission electrodes 907. When a predetermined voltage is applied to set the selected metal layer at a high potential by arbitrarily selecting the electrodes $902_1$ to $902_3$ and the metal layers $904_1$ to $904_3$, the diodes at the desired positions are turned on. As shown in FIGS. 39A and 39B, a voltage V1 is applied to the electrode $902_1$ and a voltage of 0 V is sequentially applied to the metal layers $904_1$ to $904_3$ during an interval t4. In this case, the diodes $914_{11}$, $914_{12}$, and $914_{13}$ are sequentially turned on. During intervals t5 and t6, the diodes are sequentially turned on in an order from the diode $914_{21}$ to the diode $914_{33}$. In this case, a deriving electrode 906 as shown in FIG. 36 is commonly provided to the electron emission electrodes $907_{11}$ $907_{33}$ (not shown) connected to the metal layers $904_1$ to $904_3$. When a voltage is applied between the deriving electrode 906 and the target 908 such that the potential of the electrodes $907_{11}$ to $907_{33}$ is higher than that of the target 908, electrons are emitted from the conical portions of the electrodes $907_{11}$ to $907_{33}$ coupled to the diodes $914_{11}$ to $914_{33}$.

A method of forming the electron emission electrode 907 will be described below.

The single crystal growing method of forming a micropatterned heterogeneous material having a sufficiently higher nucleation density than that of the deposition surface so as to allow formation of only the single nucleus, and growing the crystal by using the single nucleus as its center has the following advantages.

(1) The shape of the electrode with the conical portion is determined by the deposition surface, the heterogeneous material, the material of the conductive target, and the deposition conditions. The electrode with the conical portion can be formed independently of the sizes of the openings of the insulating member and the deriving electrode. Therefore, an electrode with a conical portion having a desired size can be formed, and variations in its size can be prevented.

(2) Since the position of the electrode with the conical portion can be determined by the position of the heterogeneous material region. The electrode with the conical portion can be formed at a desired position with high precision. A multi type electron emission element can be formed such that its plurality of electron emission ports can be uniformly determined at fine pitches.

(3) Since the electrode with the conical portion has a conical shape unique to the single crystal and the shapes of electron emission portions are made uniform and sharp. Therefore, an additional tapering technique need not be used, and the field intensity can be uniform and high. Variations in initial operating voltage can be prevented, and electron emission efficiency can be improved.

(4) Unlike the conventional case, the single crystal can be easily formed on the amorphous insulating substate, thereby providing an electron emission element having a high dielectric breakdown voltage.

(5) Since the electron emission element can be formed by the conventional semiconductor fabrication process, a high packing density can be achieved by the easy process.

A method of growing the single crystal on the deposition surface will be described below.

Selective deposition for selectively forming a film on a deposition surface will be described below. Selective deposition is a method of selectively forming a thin film on a substate by utilizing differences of factors of the materials. The factors are surface energy, deposition coefficients, elimination coefficients, surface diffusion rates, and the like and determine the formation of the nucleus in the thin film formation process.

Figure 40:
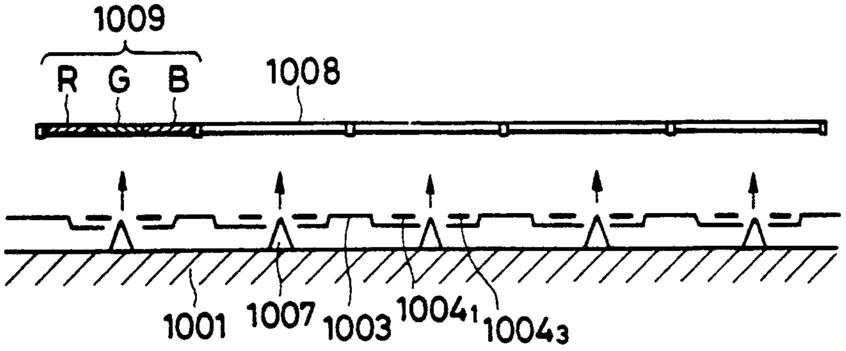
FIG. 40 is a schematic sectional view of a display device according to the present invention.

FIG. 40 is a schematic partial sectional view for explaining a display device according to the present invention.

Figure 41A:
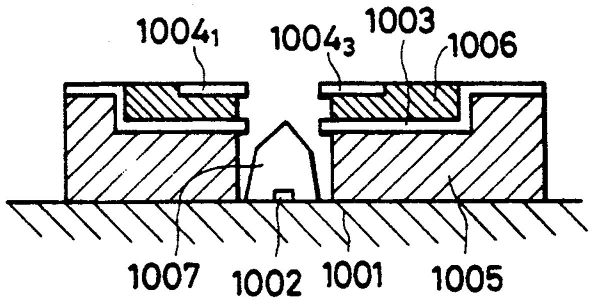
FIGS. 41A is a partial enlarged view of an electron emission portion in FIG. 40A.
Figure 41B:
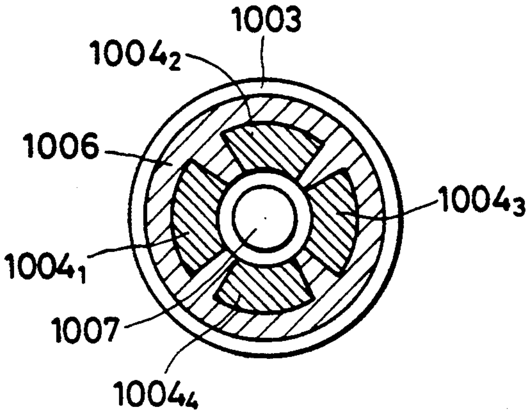
FIG. 41B is a plan view of the electron emission portion in FIG. 40A.

FIG. 41A is an enlarged view of an electron emission portion of the display device shown in FIG. 40, and FIG. 41B is a plan view of the electron emission portion.

As shown in FIGS. 40 and 41A, a plurality of nucleus formation bases 1002 consisting of a heterogeneous material such as $Si_3N_4$ are formed on an oxide substrate 1001 of an amorphous insulating material such as $SiO_2$ constituting a deposition surface. The nucleus formation bases 1002 are spaced apart from each other at equal intervals. A single crystal such as an Mo, W, or Si single crystal is grown centered on each single nucleus formed in the corresponding nucleus formation base 1002. Electrodes 1007 each having a conical portion and a desired size can be formed. The conical portion of each electrode 1007 serves as the electron emission portion. The deposition surface excluding the heterogeneous material surface serves as a surface on which the nucleus is not formed. Therefore, growth of the single crystal in a region excluding the area centered on the nucleus formation base 1002 can be prevented. A method of forming the single crystal will be described later.

An insulating layer 1005 consisting of $SiO_2$ or the like and having an opening centered on each electrode 1007 is formed, and a tray-like recess centered on the electrode 1007 is formed on the insulating layer 1005. A metal layer such as an Mo layer is formed in the recess to prepare a deriving electrode 1003. An insulating layer 1006 consisting of $SiO_2$ or the like is formed on the deriving electrode 1003. As shown in FIG. 41B, a pair of electrodes $1004_1$ and $1004_3$ and a pair of electrodes 1005 and 1006 are formed on the insulating layer $1004_2$ and $1004_4$.

A phosphor unit 1008 is formed above the electrodes 1007 and includes unit areas 1009 each consisting of a matrix of three rows and three columns, and each column or row consists of R, B and B phosphors. Adjacent unit areas are spaced apart from each other by a predetermined gap. The unit areas 1009 are formed in accordance with pitches of the electrodes 1007 so as to respectively oppose the electrodes 1007.

In the above embodiment, the deriving electrode 1003 is formed in the process for forming the metal layer such as the Mo layer. However, a metal plate having openings may be adhered to the insulating layer 1005 after the insulating layer 1005 is formed.

The operation of the display device having the above arrangement will be described below.

Figure 42:
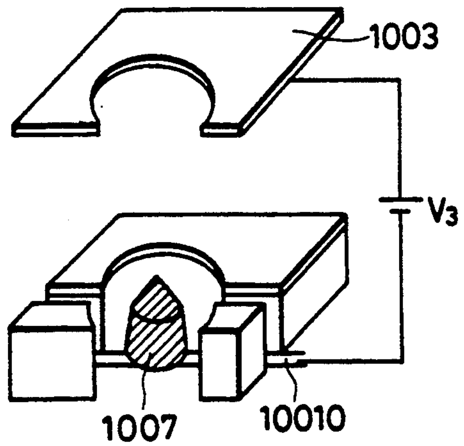
FIG. 42 is a view showing assembly of the electron emission portion.

FIG. 42 is a view showing assembly of the electron emission portion of the display device shown in FIG. 40. The electrodes $1004_1$ and $1004_3$ and the electrodes $1004_2$ and $1004_4$ are omitted for illustrative convenience.

Figure 43:
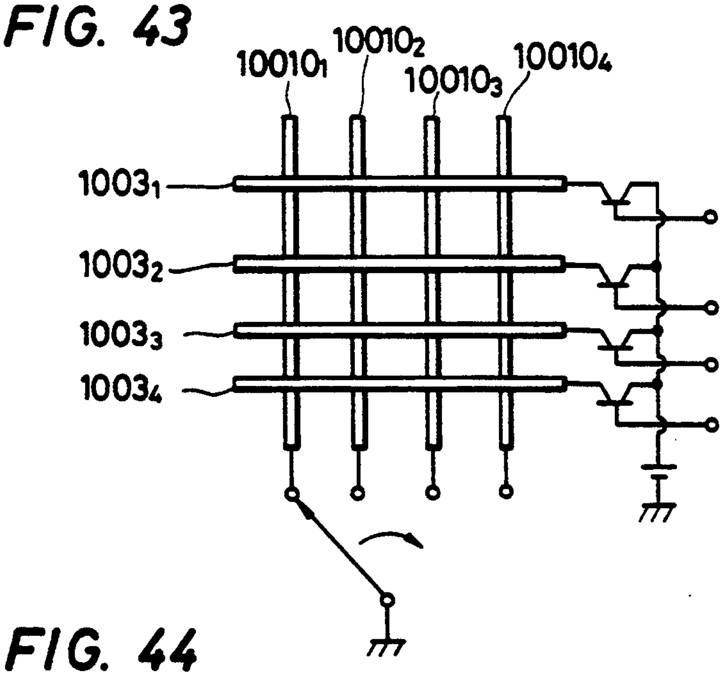
FIG. 43 is a schematic view for explaining the electron emission control operation by a matrix of wiring lines and deriving electrodes.

FIG. 43 is a schematic view for explaining electron emission operation of wiring lines and deriving electrodes which are arranged in a matrix form.

Figure 44:
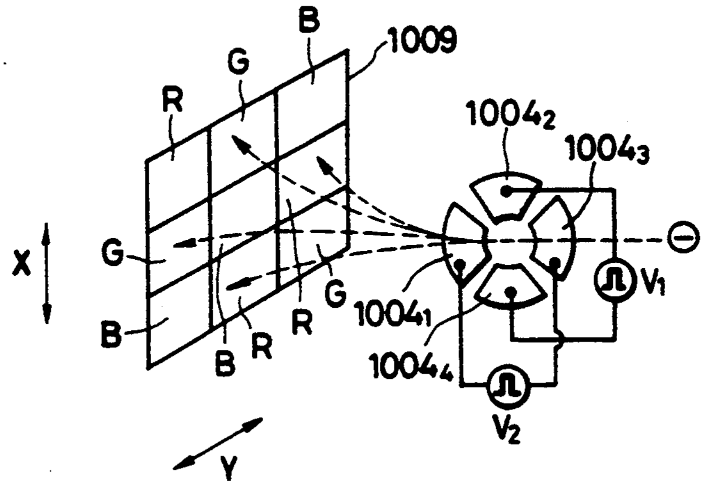
FIG. 44 is a view for explaining the operation of the display device shown in FIG. 40.
Figure 45:
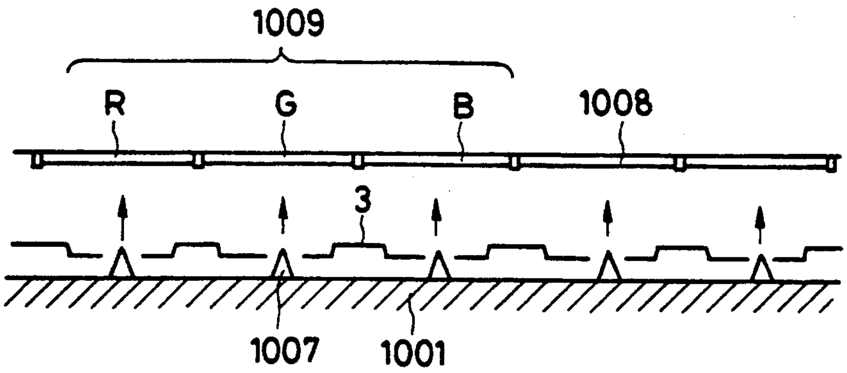
FIG. 45 is a schematic partial sectional view of another display device according to the present invention.

FIG. 44 is a view for explaining the operation of the display device shown in FIG. 40.

As shown in FIG. 43, the wiring lines of the electron emission portions can be formed such that each electrode 1007 having a conical portion is formed on the deposition surface, a groove is formed in the insulating layer, and a wiring layer (corresponding to the wiring line in FIG. 43 10010 is formed in the groove. The wiring layer 10010 is connected to the deriving electrode 1003. A voltage from a power source V3 is applied between the wiring layer 10010 and the deriving electrode 1008 such that the potential of the deriving electrode 3 is higher than that of the wiring layer 10010, and electrons are emitted from the conical portion of the electrode 1007.

Electron emission control between the wiring layer 10010 and the deriving electrode 1003 is performed such that 0 V is sequentially applied to the wiring lines $10010_1$ to $10010_4$, transistors are respectively connected to the deriving electrodes $1003_1$ to $1003_4$, and voltage signals are input to to a desired deriving electrode at a desired timing, thereby emitting electrons from the electrode 1007 at an arbitrary position.

When a voltage is applied between the selected electrode 1007 and the phosphor unit 1008 such that the potential of the phosphor unit 1008 is higher than that of the selected electrode 1007, the emitted electrons pass through the electrodes $1004_1$ and $1004_3$ and the electrodes $1004_2$ and $1004_4$ and are emitted onto the corresponding unit area 1009 in the phosphor unit 1008. At this time, when a predetermined voltage from a power source V2 is applied between the electrodes $1004_1$ and $1004_3$, the electron can be deflected in the Y direction in FIG. 44. When a predetermined voltage from the power source V1 is applied between the electrodes $1004_2$ and $1004_4$, the electron is deflected in the X direction in FIG. 44.

In the display device having the arrangement described above, the amount of electron emission is controlled by control of voltage applied to the wiring layer 10010 and the deriving electrode 1003. The electrons can be emitted at a desired position of each phosphor area constituting the unit area 1009 by voltages applied to the electrodes $1004_1$ and $1004_3$ and the electrodes $1004_2$ and $1004_4$.

In the above embodiment, the electrode with the conical portion need not consist of a single crystal but may be made of a non-monocrystalline material such as a polycrystal. However, if the electrode with the conical portion consists of a single crystal, the shapes of the electron emission portions can be made uniform and sharp. An additional tapering technique need not be utilized, and the field intensity can be increased with uniformity. Variations in initial operating voltage can be prevented, and the conductivity and electron emission efficiency can be improved.

The single crystal growing method of forming a micropatterned heterogeneous material having a sufficiently higher nucleation density than that of the deposition surface so as to allow formation of only the single nucleus, and growing the crystal by using the single nucleus as its center has the following advantages.

(1) The shape of the electrode with the conical portion is determined by the deposition surface, the heterogeneous material, the material of the conductive member, and the deposition conditions. An electrode with a conical portion having a desired size can be formed, and variations in its size can be prevented.

(2) Since the position of the electrode with the conical portion can be determined by the position of the heterogeneous material region. The electrode with the conical portion can be formed at a desired position with high precision. A multi type electron emission element can be formed such that its plurality of electron emission ports can be uniformly determined at fine pitches.

(3) Unlike the conventional case, the single crystal can be easily formed on the amorphous insulating substate, thereby providing an electron emission element having a high dielectric breakdown voltage. In addition, since the amorphous insulating substrate is relatively inexpensive and can be formed in a large area, a display device having a large area can be easily formed.

(4) Since the electron emission element can be formed by the conventional semiconductor fabrication process, a high packing density can be achieved by the easy process.

Still another embodiment of the present invention will be described below.

In this embodiment, a conical portion of an electrode consists of at least a semiconductor crystal formed by nucleus growth and a material having a low work function to obtain a display device of a low voltage, thereby improving electron emission efficiency.

The semiconductor crystal may be a p- and/or n-type semiconductor crystal. A p-type semiconductor crystal and a material having a low work function are used to emit electrons in the following description.

The principle of the electron emission operation will be described below.

Figure 46:
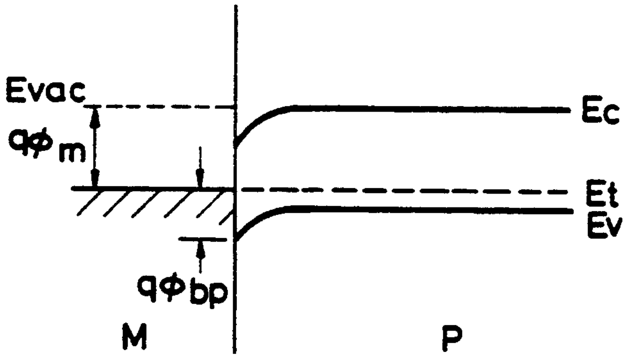
FIG. 46 is an energy band diagram of a metal-semiconductor junction.

FIG. 46 is an energy band diagram of a metal-semiconductor junction.

Figure 47:
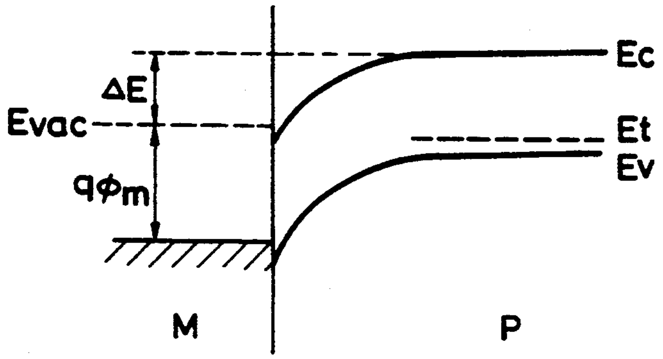
FIG. 47 is an energy band diagram on the semiconductor surface according to the present invention.

FIG. 47 is an energy band diagram on the surface of the p-type semiconductor.

As shown in FIG. 46, in order to obtain an NEA state wherein a vacuum level Evac is lower than the energy level of a conduction band Ec of the p-type semiconductor, a material for decreasing a work function $\phi_m$ must be formed on the surface of the semiconductor. A typical example of such a material is an alkali metal, and in particular Cs, Cs—O, or the like. If the state in which the work function $\phi_m$ on the semiconductor surface is low, and further the NEA state is obtained, electrons injected into the p-type semiconductor can be easily emitted, thereby obtaining an electron emission element having high electron emission efficiency.

The junction between the p-type semiconductor and the material having a low work function is reverse-biased to set the vacuum level Evac to a level lower than that of the conduction band Ec of the p-type semiconductor. As a result, a larger energy difference $\Delta E$ than the conventional energy difference can be easily obtained. Even if the vacuum level Evac is higher than the energy level of the conduction band Ec of the p-type semiconductor in an equilibrium state, the NEA state can be easily obtained by using a chemically stable material having a relatively high work function $\phi_m$ but being defined as a low-work function material.

The electron emission structure described above is used in an arrangement similar to a field effect electron emission element to obtain a low-voltage element and hence improve electron emission efficiency.

It is possible to prepare an electron emission element by using an n-type semiconductor crystal and a material having a low work function, as described by Philips J. Res. 39, 59–60, 1984.

The single crystal growing method of forming a micropatterned heterogeneous material having a sufficiently higher nucleation density than that of the deposition surface so as to allow formation of only the single nucleus, and growing the crystal by using the single nucleus as its center has the following advantages.

(1) The single nucleus consisting of the heterogeneous material is formed in only the nucleus formation surface, and the nucleus is not formed on the deposition surface region serving as the surface on which the nucleus is not formed. Therefore, the conical portion of the electrode consists of only a single crystal. The facet unique to the single crystal can be used as a conical portion of the electron emission portion.

(2) The shape of the electrode with the conical portion is determined by the manufacturing conditions such as the deposition surface, the heterogeneous material surface, the material of the electrode, and the deposition conditions. Therefore, an electrode having a desired size can be formed, and its variations can be prevented.

(3) The position of the electrode having the conical portion is determined by the position of the heterogeneous material surface. The electrode with the conical portion can be formed at a desired position with high precision.

(4) Unlike in the conventional method, a single crystal can be easily formed on an amorphous insulating surface.

(5) The electron emission element can be formed according to the conventional semiconductor fabrication process, and its packing density can be increased by the easy process.

An electron emission element according to still another method of the present invention will be described in detail with reference to FIGS. 49 to 50(B).

Figure 48:
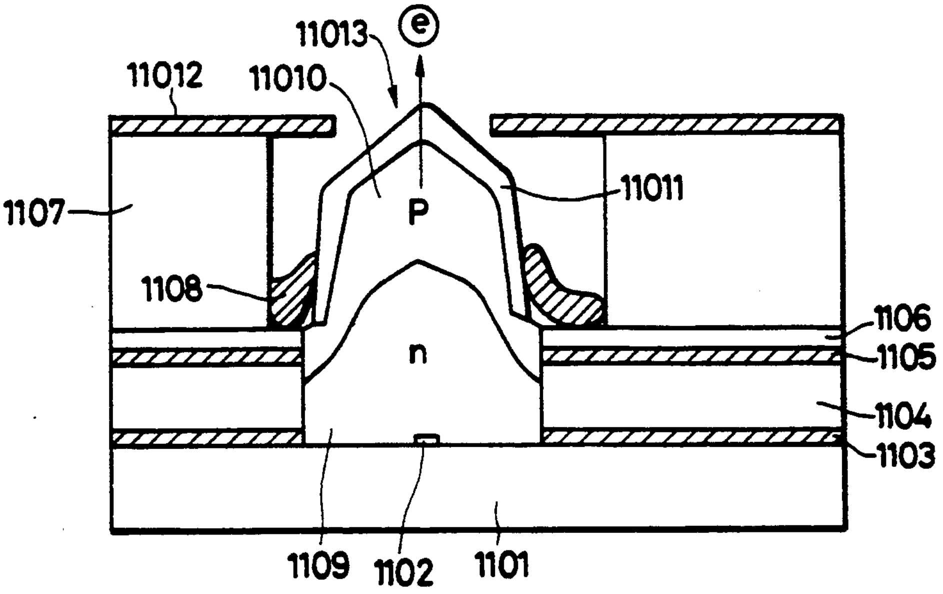
FIG. 48 is a schematic partial sectional view for explaining an electron emission element according to the present invention.

FIG. 48 is a schematic partial sectional view of this electron emission element. FIG. 49 is a view for explaining the operation of the electron emission element.

Figure 49:
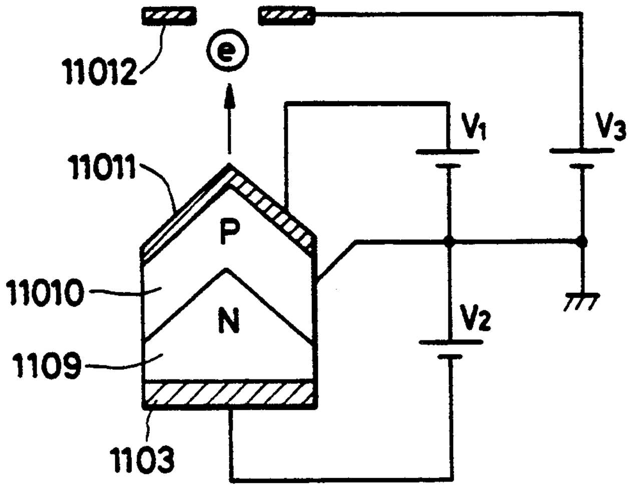
FIG. 49 is a view for explaining the operation of the element shown in FIG. 48.

Referring to FIGS. 48 and 49, a nucleus formation base 1102 consisting of a heterogeneous material such as $Si_3N_4$ is formed on an oxide substrate 1001 consisting of an amorphous insulating material such as $SiO_2$ and constituting a deposition surface. A single crystal such as an Si single crystal is grown centered on a single nucleus formed in each nucleus formation base 1102 while an n-type impurity is doped therein. An n-type semiconductor region 1109 is formed. An p-type semiconductor region 11010 is formed on the n-type semiconductor region 1109 while an p-type impurity is doped. The p-type semiconductor region 11010 has a facet unique to the single crystal. A 100-Å thick low work function material region 11011 consisting of CsSi or the like is formed on the p-type semiconductor region 11010 to prepare an electrode 11013 with a conical portion serving as an electron emission portion. A preferable low work function material has a work function of 2.5 eV or less and can be exemplified by Li, Na, K, Rb, Sr, Cs, Ba, Eu, Yb, or Fr. If stabilization of the low work function material region 11011 is taken into consideration, an alkali metal silicide such as CsSi or RbSi may be used. A method of forming the single crystal will be described later.

The n-type semiconductor region 1109 of the electrode 11013 is connected to a conductive layer 1103 formed on the oxide substrate 1101. An insulating layer 1104 consisting of $SiO_2$ or the like and having an opening centered on the electrode 11013 formed on the conductive layer 1103 is formed. A conductive layer 1105 connected to the p-type semiconductor region 11010 is formed on the insulating layer 1104. An insulating layer 1106 is formed on the conductive layer 1105. A conductive region 1108 connected to the low work function material region 1109 is formed on the insulating layer 1106. An insulating layer 1107 is formed on the insulating layer 1106 except for the conductive region 1108, and a deriving electrode 11012 is formed on the insulating layer 1107.

In the element having the above structure, a voltage V2 is applied between the n- and p-type semiconductor regions 1109 and 11010 such that the potential of the p-type semiconductor region is higher than that of the n-type semiconductor region. A reverse biasing voltage V1 is applied between the p-type semiconductor region 11010 and the low work function material region 11011. A voltage V3 is applied between the p-type semiconductor region 11010 and the deriving electrode 11012 such that the potential of the deriving electrode 11012 is higher than that of the p-type semiconductor region 11010. Under these conditions, electrons can be emitted from the surface of the low work function material region 11011. The above operation will be described below.

Figure 50A:
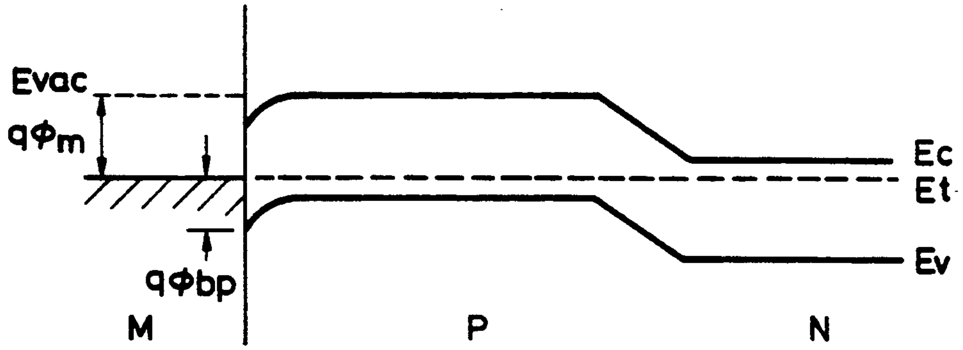
FIG. 50A is an energy band diagram in an equilibrium state of the element in FIG. 48.
Figure 50B:
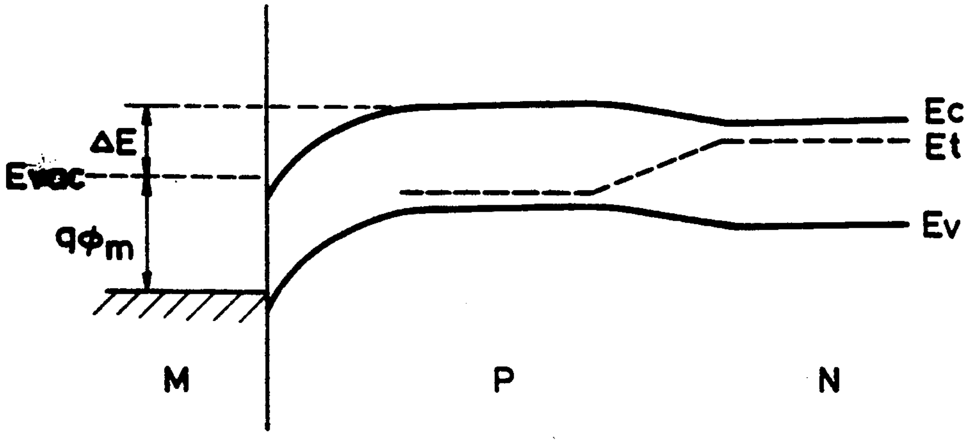
FIG. 50B is an energy band diagram when the element in FIG. 48 is operated.

FIG. 50A is an energy band diagram in a equilibrium state, and FIG. 50B is an energy band diagram when the element is operated.

As shown in FIG. 49, when the forward biasing voltage V2 is applied to the p-n junction and a reverse biasing voltage V1 is applied between the p-type semiconductor region 11010 and the low work function material region 11011, the energy band is changed as shown in FIG. 50B to obtain the NEA state in which the vacuum level Evac is lower by ΔE from that of the conduction band Ec of the p-type semiconductor region 11010. For this reason, the electrons injected from the n-type semiconductor region 1109 to the p-type semiconductor region 11010 are emitted from the surface of the low work function material region 11011, and therefore high electron emission efficiency with a larger ΔE than that of the conventional case can be obtained.

In order to increase ΔE by reverse biasing, the metal material is not limited to Cs or Cs—O which has a small work function. However, the material can be selected from a wide material range including alkali metals and alkali earth metals. A stabler material can be selected.

A positive voltage is applied to the deriving electrode 11012 in this embodiment, so that a decrease in work function by the Schottky effect occurs. Therefore, a larger amount of electron emission can be obtained.

The single crystal growing method of forming the p- and n-type semiconductor regions by forming a micropatterned heterogeneous material having a sufficiently higher nucleation density than that of the deposition surface so as to allow formation of only the single nucleus, and growing the crystal by using the single nucleus as its center has the following advantages.

(1) The shape of the electrode with the conical portion is determined by the deposition surface, the heterogeneous material, the material of the conductive member, and the deposition conditions. The electrode with the conical portion can be formed independently of the size of the opening of the deriving electrode. Therefore, an electrode with a conical portion having a desired size can be formed, and variations in its size can be prevented.

(2) Since the position of the electrode with the conical portion can be determined by the position of the heterogeneous material region. The electrode with the conical portion can be formed at a desired position with high precision. A plurality of electron emission ports of the electron emission portions can be uniformly determined at fine pitches.

(3) Since the p-type semiconductor region has a conical shape unique to the single crystal and the shape of the electron emission portion can be made uniform and sharp, an additional tapering technique need not be used. The field intensity can be uniform and high, variations in initial operating voltage can be prevented, and the conductivity of the electrode with the conical portion can be improved. Therefore, electron emission efficiency can be improved.

(4) Unlike the conventional case, the single crystal can be easily formed on the amorphous insulating substate, thereby providing an electron emission element having a high dielectric breakdown voltage.

(5) Since the electron emission element can be formed by the conventional semiconductor fabrication process, a high packing density can be achieved by the easy process.

A method of growing the single crystal on the deposition surface will be described below.

Selective deposition for selectively forming a film on a deposition surface will be described below. Selective deposition is a method of selectively forming a thin film on a substate by utilizing differences of factors of the materials. The factors are surface energy, deposition coefficients, elimination coefficients, surface diffusion rates, and the like and determine the formation of the nucleus in the thin film formation process.

We claim:

1. A multi type electron emission element comprising a plurality of electrodes formed on a deposition surface of a material having a factor critical to nucleation and each having a conical portion of a single crystal on a nucleus, an insulating layer formed on said deposition surface and having openings respectively centered on said conical portions, and a deriving electrode part of which is formed near at least said conical portions, said deriving electrode being formed on said insulating layer.

2. An element according to claim 1, wherein said deposition surface is formed on a desired underlying material.

3. An element according to claim 1 or 2, wherein said plurality of electrodes each with said conical portion are arranged to constitute electrode arrays, electrode wiring layers are formed to connect said electrodes of said electrode arrays, respectively, to constitute a matrix form.

4. An electron emission element comprising an electrode formed on a deposition surface of a material having a factor critical to nucleation and having a conical portion, an insulating layer formed on said deposition surface and having an opening centered on said conical portion, and a deriving electrode formed on said insulating layer near said conical portion, wherein said electrode with said conical portion consists of a single crystal on a nucleus, and wherein said deposition surface is formed on a desired underlying material.

5. An element according to claim 4, wherein said deposition surface consists of an amorphous material.

6. An electron emission element having high-resistance films formed on a deposition surface of an insulating material and electrodes formed at both ends of said high-resistance films, wherein a plurality of regions of a heterogeneous material are formed on said high-resistance film, the heterogeneous material having a sufficiently higher nucleation density than that of a material of said deposition surface and micropatterned to allow growth of only single nuclei, and said high-resistance films are respectively formed of crystal regions having a plurality of conical portions centered on said single nuclei grown in said regions of the heterogeneous material.

7. An element according to claim 6, wherein a deriving electrode is formed above said high-resistance films.

8. An element according to claim 6 or 7, wherein said deposition surface is formed on a desired underlying material.

9. An electron emission device comprising:
- an electron emission electrode with a conical portion consisting of a single crystal on a nucleus formed on a deposition surface of a material having a factor critical to nucleation;
- a voltage application electrode formed to oppose said electron emission electrode through an insulating layer;
- a target to be irradiated with electrons emitted from said electron emission electrode;
- charge supply means for supplying charge to said electron emission electrode; and
- means for applying a voltage between said voltage application electrode and said target.

10. A device according to claim 9 wherein said charge supply means comprises a deriving electrode.

11. An electron emission device comprising:
- a plurality of electron emission electrodes each with a conical portion consisting of a single crystal on a nucleus;
- a plurality of voltage application electrodes formed to oppose said plurality of electron emission electrodes through an insulating layer;
- a target to be irradiated with electrons emitted from said plurality of electron emission electrodes;
- charge supply means for supplying charge to said plurality of electron emission electrodes; and
- means for applying a voltage between said plurality of voltage application electrodes and said target.

12. A device according to claim 11, wherein said charge supply means comprises a deriving electrode.

13. A device according to claim 11, wherein said means for applying the voltage between said plurality of voltage application electrodes and said target includes means for time-divisionally applying a voltage to said plurality of voltage application electrodes and a voltage between said plurality of voltage application electrode and said target.

14. An electron emission device comprising:
- an electron emission electrode with a conical portion consisting of a single crystal on a nucleus;
- a voltage application electrode formed to oppose said electron emission electrode through an insulating layer;
- a target to be irradiated with electrons emitted from said electron emission electrode; and
- means for applying a voltage between said voltage application electrode and said target,
- wherein said insulating layer consists of a semiconductive material.

15. An electron emission device comprising:
- a plurality of electron emission electrodes each with a conical portion consisting of a single crystal on a nucleus;

a plurality of voltage application electrodes formed to oppose said plurality of electron emission electrodes through an insulating layer;

a target to be irradiated with electrons emitted from said plurality of electron emission electrodes; and means for applying a voltage between said plurality of voltage application electrodes and said target, wherein said insulating layer consists of a semiconductive material.

16. A device according to claim 15, wherein said means for applying the voltage between said plurality of voltage application electrodes and said target includes means for time-divisionally applying a voltage to said plurality of voltage application electrodes and a voltage between said plurality of voltage application electrodes and said target.

17. An electron emission element comprising an electrode formed on a deposition surface of a material having a factor critical to nucleation and having a conical portion consisting of a single crystal on a nucleus, and a deriving electrode formed on said deposition surface through an insulating layer and located near said conical portion, wherein said electrode with said conical portion comprises a conductive member with said conical portion and a heat-resistive conductive film formed on said conductive member, and wherein said deposition surface is formed on a desired underlying material.

18. An element according to claim 17, wherein said conductive member with said conical portion is formed by a crystal centered on a single nucleus grown in a heterogeneous material formed on said deposition surface, the heterogeneous material having a sufficiently higher nucleation density than that of a material of said deposition surface and micropatterned to allow growth of only said single nucleus.

19. A display device comprising an electrode formed on a deposition surface and having a conical portion consisting of a single crystal on a nucleus, a deriving electrode formed on said deposition surface near said conical portion, and a phosphor unit formed to oppose said electrode with said conical portion, wherein said phosphor unit is energized with electrons emitted from said electrode with said conical portion.

20. A device according to claim 19, wherein a deflection electrode is formed between said deriving electrode and said phosphor unit, and a plurality of phosphor areas are formed in a moving distance range of electrons deflected by said deflection electrode, the moving distance range falling within said phosphor unit.

21. A device according to claim 20, wherein said electrode with said conical portion is made of a single crystal centered on a single nucleus grown in a heterogeneous material formed on said deposition surface, the heterogeneous material having a sufficiently higher nucleation density than that of a material of said deposition surface and micropatterned to allow growth of only said single nucleus.

22. A device according to claim 20, wherein said deposition surface is formed on a desired underlying material.

23. A device according to claim 21, wherein said deposition surface consists of an amorphous insulating material.

24. An electron emission device comprising:

an electrode formed on a conductive material through an insulating layer having a factor critical to nucleation and having a conical portion consisting of a single crystal on a nucleus;

a deriving electrode formed on said insulating layer through an insulating layer and located near said conical portion; and means for applying a voltage between said conductive material and said electrode.

25. A device according to claim 24, wherein said electrode with said conical portion is made of a single crystal centered on a single nucleus grown in a heterogeneous material formed on said deposition surface, the heterogeneous material having a sufficiently higher nucleation density than that of a material of said deposition surface and micropatterned to allow growth of only said single nucleus.

26. A device according to claim 24, further comprising wiring electrodes each connecting each array of said electrodes each with said conical portion, and wiring electrodes made of said conductive material and formed therewith through said insulating layer to constitute a matrix form.

* * * * *

UNITED STATES PATENT AND TRADEMARK OFFICE

CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

ON THE TITLE PAGE

At [75] "Inventors:"

"Itsukaichi" should read --Tokyo;--.

At [57] "ABSTRACT"

Line 1, "multi type" should read --multi-type--.
Line 7, "trodes," should read --trode--.

COLUMN 1

Line 32, "field" should read --field emission is available--.

COLUMN 5

Line 28, "are larged" should read --is increased--.

COLUMN 6

Line 2, "multi type" should read --multi-type--.

COLUMN 8

Line 62, "multi type" should read --multi-type--.
Line 67, "multi type" should read --multi-type--.

UNITED STATES PATENT AND TRADEMARK OFFICE
CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

COLUMN 10

Line 38, "multi type" should read --multi-type--.
Line 48, "multi electron" should read --multi-electron--.

COLUMN 11

Line 23, "re" should read --are--.
Line 42, "view" should be deleted.
Line 63, "multi type" should read --multi-type--.

COLUMN 12

Line 1, "FIGS. 41A" should read --FIG. 41A--.
Line 34, "multi type" should read --multi-type--.

COLUMN 13

Line 1, "multi type" should read --multi-type--.
Line 3, "multi type" should read --multi-type--.
Line 11, "multi type" should read --multi-type--.
Line 14, "multi electron" should read --multi-electron--.
Line 17, "multi electron" should read --multi-electron--.
Line 34, "multi elec-" should read --multi-elec- --.
Line 51, "multi electron" should read --multi-electron--.
Line 55, "multi electron" should read --multi-electron--.

UNITED STATES PATENT AND TRADEMARK OFFICE
CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

COLUMN 14

Line 3, "multi type" should read --multi-type--.
Line 16, "multi type" should read --multi-type--.

COLUMN 17

Line 34, "$SiH_2Cl_2$and" should read --$SiH_2Cl_2$ and--.

COLUMN 18

Line 48, "substrate)." should read --substrate.--.

COLUMN 19

Line 45, "multi type" should read --multi-type--.
Line 60, "multi type" should read --multi-type--.

COLUMN 20

Line 13, "multi type" should read --multi-type--.

COLUMN 22

Line 1, "consists" should read --consist--.
Line 31, "multi type" should read --multi-type--.

COLUMN 24

Line 7, "multi type" should read --multi-type--.

UNITED STATES PATENT AND TRADEMARK OFFICE

CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

COLUMN 30

Line 39, "multi type" should read --multi-type--.
Line 66, "electrode" should read --electrodes--.

COLUMN 32

Line 18, "emission. During" should read --emission, during--.

COLUMN 33

Line 42, "Ω/%" (both occurrences) should read --Ω/□--.
Line 43, "Ω/%" should read --Ω/□--.

COLUMN 37

Line 12, "multi type" should read --multi-type--.

COLUMN 38

Line 11, "$LAB_6$," should read --$LaB_6$,--.

COLUMN 39

Line 25, "multi type" should read --multi-type--.

UNITED STATES PATENT AND TRADEMARK OFFICE

CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

COLUMN 40

Line 67, "multi type" should read --multi-type--.

COLUMN 41

Line 48, "multi type" should read --multi-type--.

COLUMN 43

Line 13, "electrode 3" should read --electrode 1003--.

COLUMN 44

Line 5, "multi type" should read --multi-type--.

COLUMN 45

Line 49, "an p-type" should read --a p-type--.

UNITED STATES PATENT AND TRADEMARK OFFICE
CERTIFICATE OF CORRECTION

PATENT NO. : 5,361,015

DATED : November 1, 1994

INVENTORS : MASAHIKO OKUNUKI ET AL.

It is certified that error appears in the above-identified patent and that said Letters Patent is hereby corrected as shown below:

COLUMN 47

Line 1, "region. The" should read --region, the--.
Lines 23-24, delete lines 23 and 24.

Signed and Sealed this

Fourth Day of July, 1995

Attest:

Bruce Lehman

BRUCE LEHMAN

Attesting Officer

*Commissioner of Patents and Trademarks*